United States Patent
Kobachi et al.

[11] Patent Number: 5,811,797
[45] Date of Patent: Sep. 22, 1998

[54] PHOTOREFLECTIVE DETECTOR INCLUDING A LIGHT EMITTING ELEMENT AND A LIGHT RECIEVING ELEMENT LOCATED AT DIFFERENT DISTANCES FROM AN OBJECT REFLECTING LIGHT FROM THE EMITTING ELEMENT

[75] Inventors: Mitsuo Kobachi, Ayama-gun; Akihiro Fujita; Naoto Hasegawa, both of Kitakatsuragi-gun, all of Japan

[73] Assignee: Sharp Kabushiki Kaisha, Osaka, Japan

[21] Appl. No.: 694,063

[22] Filed: Aug. 8, 1996

[30] Foreign Application Priority Data

Sep. 20, 1995 [JP] Japan ..................................... 7-241049
Mar. 28, 1996 [JP] Japan ..................................... 8-075008

[51] Int. Cl.⁶ .................................................. G02B 27/00
[52] U.S. Cl. .............................. 250/239; 250/551; 257/81
[58] Field of Search ..................................... 250/239, 551, 250/208.1, 216; 257/81, 82, 698

[56] References Cited

U.S. PATENT DOCUMENTS 3,862,415  1/1975  Harnden, Jr. et al. .................. 250/239
3,914,309  10/1975  Swensen ................................. 250/239
4,900,910  2/1990  Doi .
5,567,953  10/1996  Horinouchi et al. .................... 250/551

FOREIGN PATENT DOCUMENTS 0 661 759 A1  7/1995  European Pat. Off. .
62-69111  3/1987  Japan .
62132377  6/1987  Japan .
62-252178  11/1987  Japan .
07045859  2/1995  Japan .
07122779  5/1995  Japan .

Primary Examiner—Edward P. Westin
Assistant Examiner—Kevin Pyo
Attorney, Agent, or Firm—Nixon & Vanderhye, PC

[57] ABSTRACT

A photoreflective detector includes a light emitting element; and a light receiving element located so as to receive light emitted from the light emitting element and reflected by an object. The light emitting element and the light receiving element are located to have different distances from the object so as to avoid direct incidence of the light emitted by the light emitting element on the light receiving element.

30 Claims, 33 Drawing Sheets

Y-axis rotation direction

X-axis rotation direction

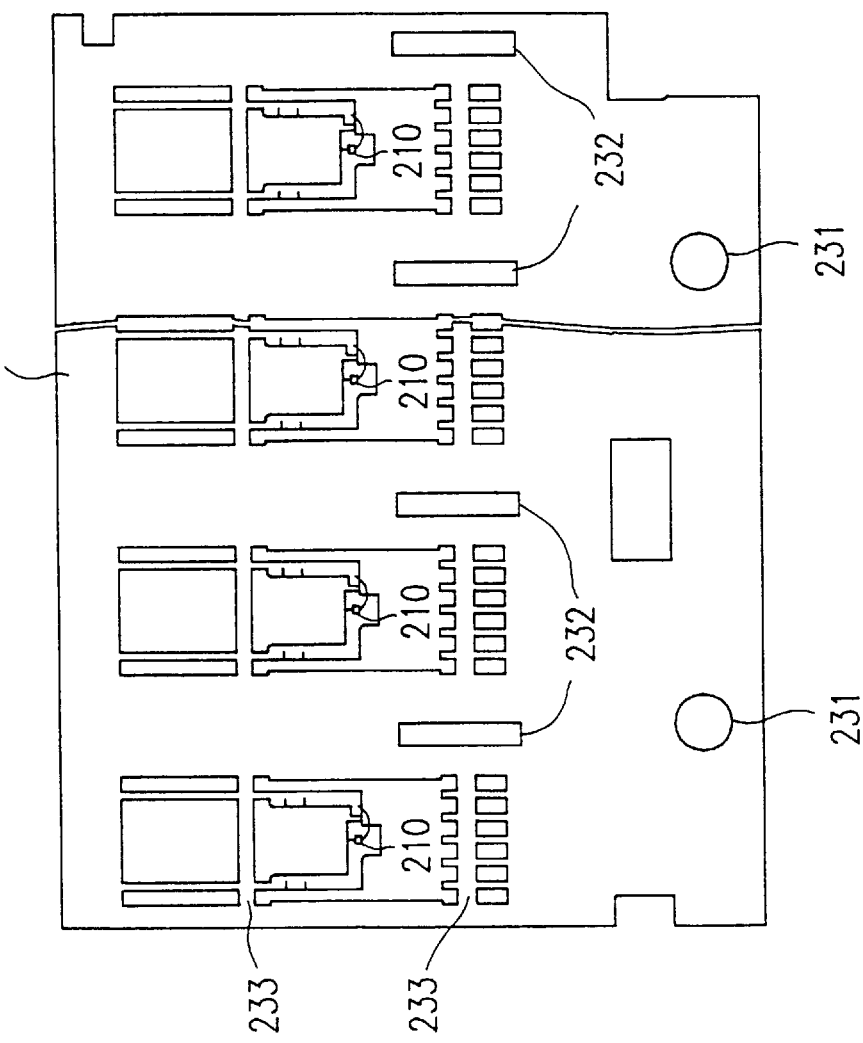

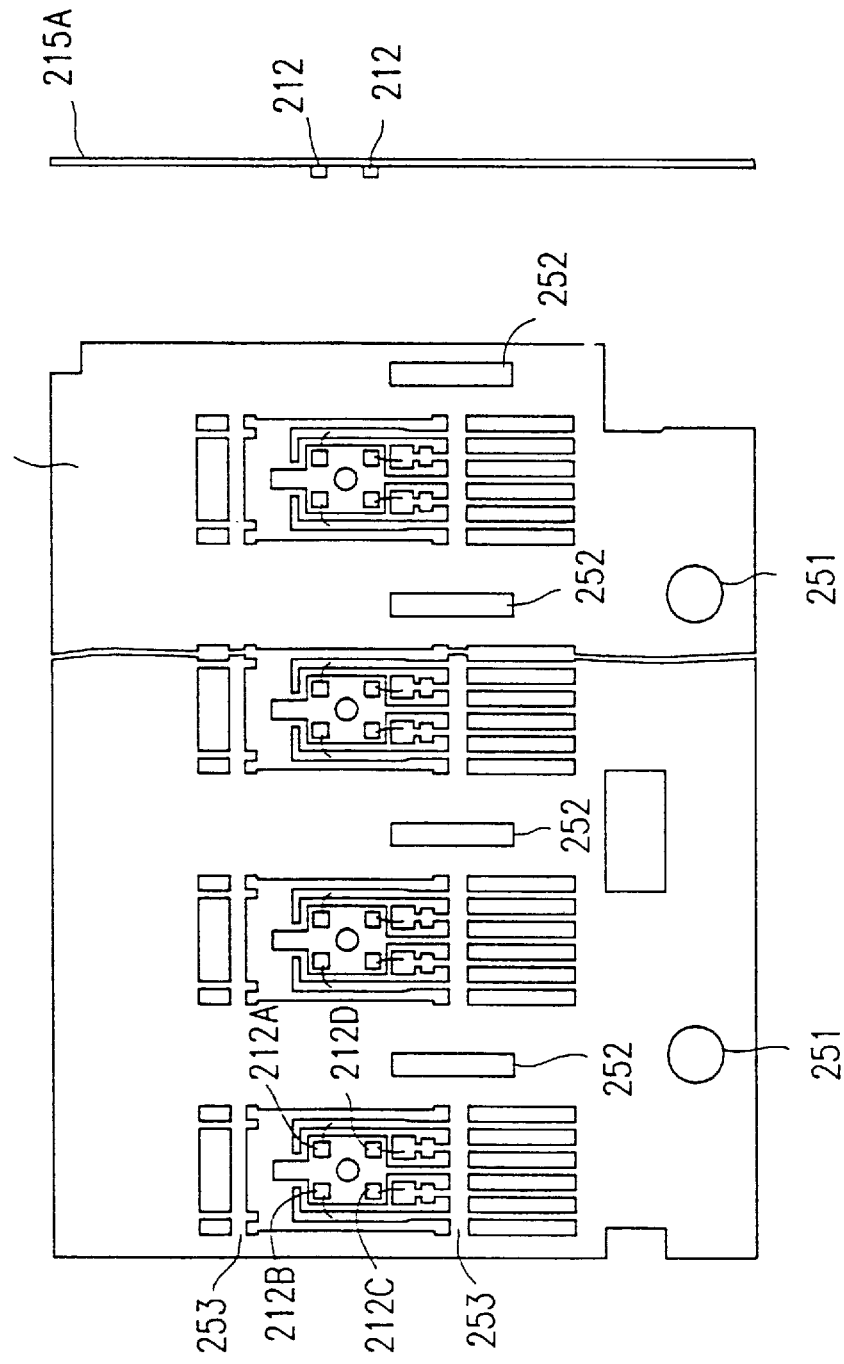

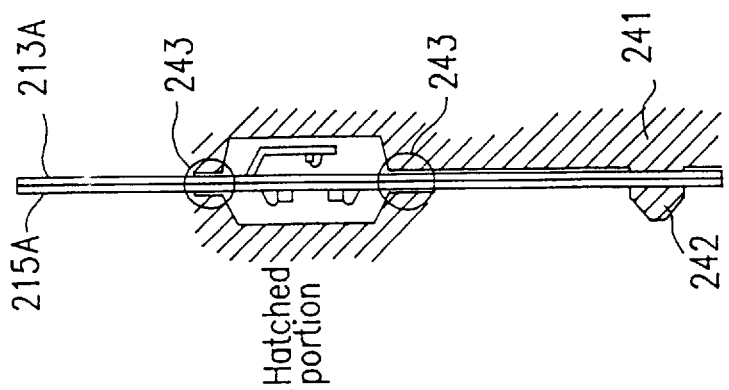
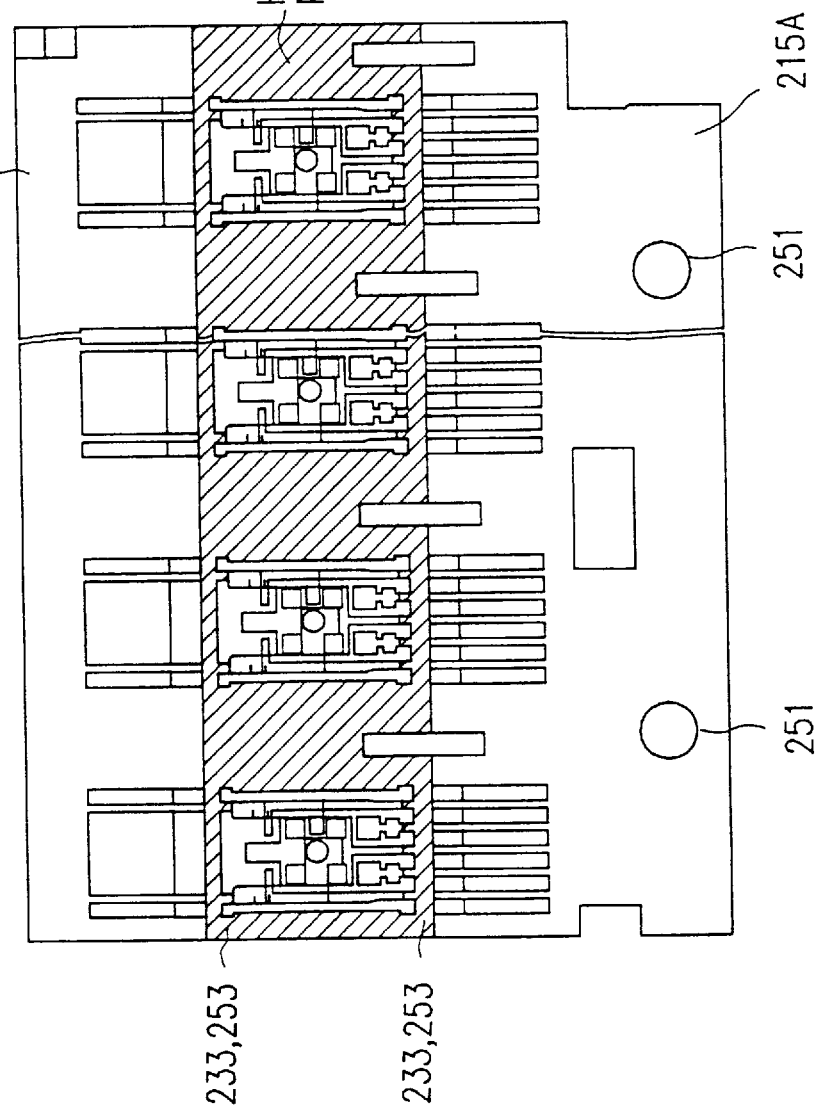

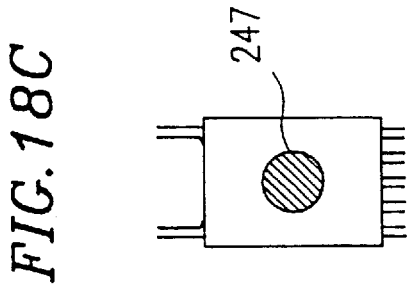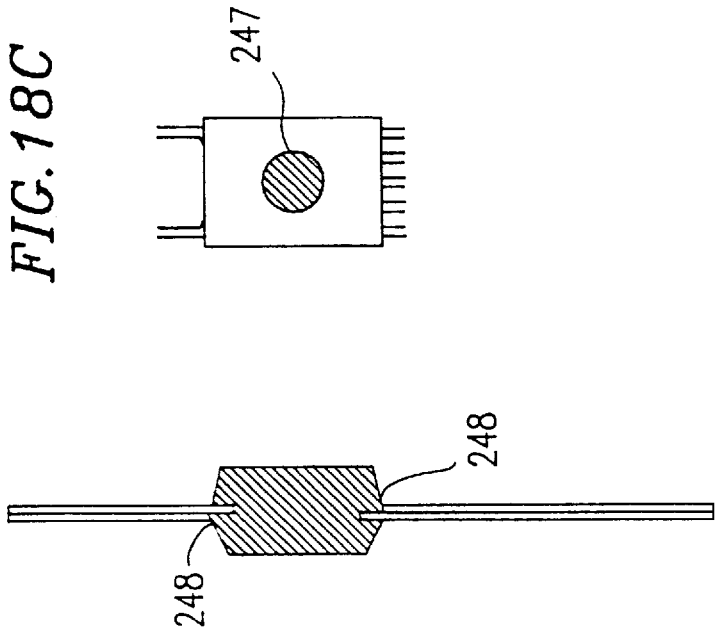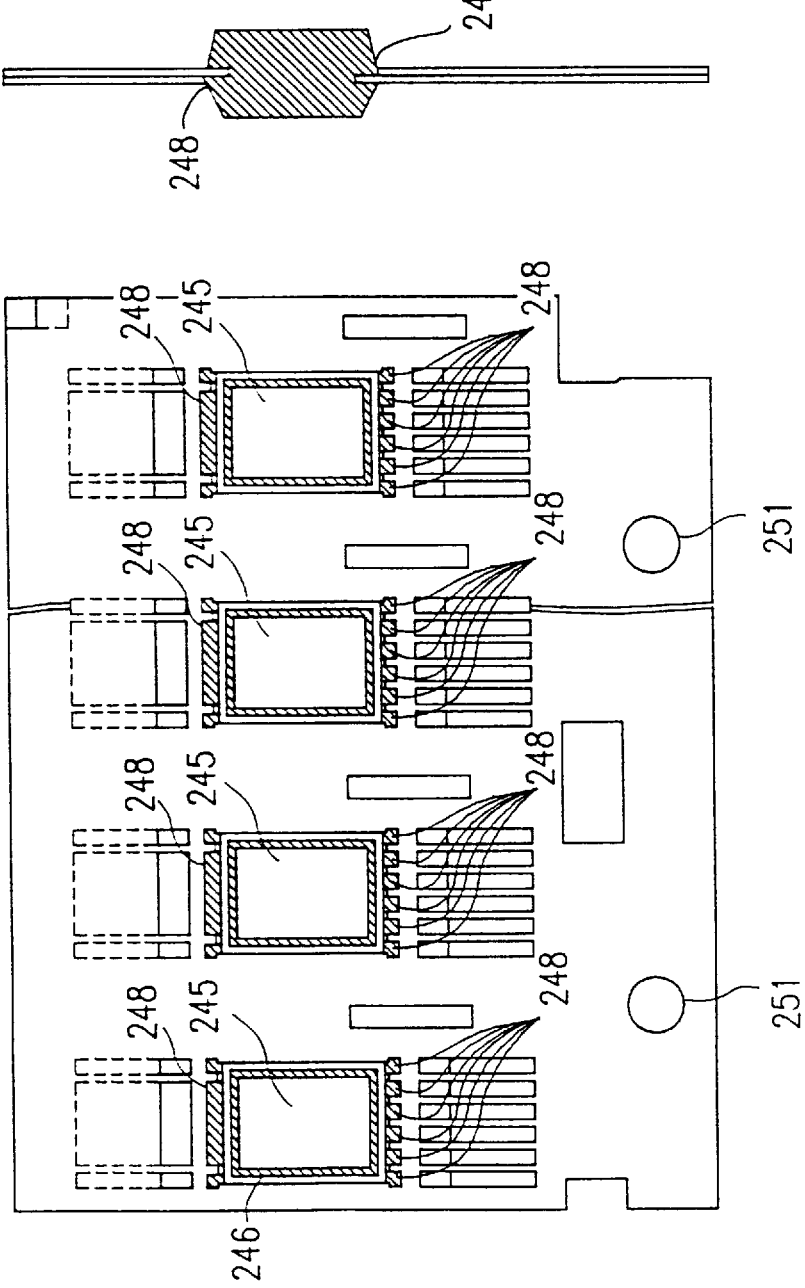

Coordinate

X-axis rotation direction

Y-axis rotation direction

X-axis rotation

Y-axis rotation

PHOTOREFLECTIVE DETECTOR INCLUDING A LIGHT EMITTING ELEMENT AND A LIGHT RECIEVING ELEMENT LOCATED AT DIFFERENT DISTANCES FROM AN OBJECT REFLECTING LIGHT FROM THE EMITTING ELEMENT

BACKGROUND OF THE INVENTION

1. Field of the Invention

The present invention relates to a photoreflective detector, such as a photoreflective photointerruptor, for detecting the existence and position of an object, the tilt direction and angle of the object, etc., and a method for producing such a photoreflective detector.

2. Description of the Related Art

FIG. 1A is a cross sectional view of a conventional photoreflective detector 10, such as a photoreflective photointerruptor, for detecting the tilt direction and angle of an object by the direction of the light reflected by the object. FIG. 1B is a plan view of the photoreflective detector 10.

As is shown in FIGS. 1A and 1B, the conventional photoreflective detector 10 includes a substrate 1, a light emitting element 2 provided on the substrate 1 by die- and wire-bonding, and four light receiving elements 3A through 3D provided on the substrate 1 also by die- and wire-bonding. The four light receiving elements 3A through 3D are located equidistant from each other in a circular pattern having the light emitting element 2 as the center of the circle. Light L emitted by the light emitting element 2 is collected by a lens 4 provided above the substrate 1 and incident on the object 5. The light L is then reflected by the object 5 to be reflected light L' and is collected again by the lens 4. The reflected light L' forms an image represented by the dashed line in FIG. 1B and is incident on the light receiving elements 3A through 3D. In FIG. 1B, the optical outputs from the light receiving elements 3A through 3D have an equal level to one another.

FIGS. 2A and 2B are respectively a cross sectional view and a plan view of the photoreflective detector 10, illustrating a light path obtained when the object 5 is tilted at $\Delta\theta$. As is shown in FIG. 2B, the position of the image formed by the reflected light L' on the substrate 1 changes in accordance with the tilt angle of the object 5. In the state shown in FIG. 2B, the optical outputs from the light receiving elements 3A through 3D have different levels from one another.

The difference between an output $S_A$ from the light receiving element 3A and an output $S_C$ from the light receiving element 3C can be evaluated with, for example, expression (1).

$$S=(S_A-S_C)/(S_A+S_C) \quad (1)$$

The relationship between tilt angle $\Delta\theta$ of the object 5 and detection factor S obtained above is shown in FIG. 3. Specifically, detection factor S changes linearly with respect to tilt angle $\Delta\theta$ of the object 5 in a certain range of angles. Accordingly, tilt angle $\Delta\theta$ can be detected by obtaining detection factor S from expression (1).

The above explanation concerns the light receiving elements 3A and 3C. The same operation can be performed using the optical outputs from the light receiving elements 3B and 3D to detect the tilt direction and angle of the object 5 two-dimensionally.

In the above-described conventional photoreflective detector 10, the light emitting element 2 and the light receiving elements 3A through 3D are located on the same substrate 1. In such a structure, light La emitted from side surfaces of the light emitting element 2 (FIGS. 1A and 2A) is directly incident on the light receiving elements 3A through 3D. Since the light receiving elements 3A through 3D each generate an output signal from the light La directly received and the light L' reflected by the object 5, the denominator $(S_A+S_C)$ of expression (1) increases, thereby reducing detection factor S. This indicates that the S/N ratio, which is the ratio of signal component S obtained by the light L' reflected by the object 5 with respect to non-signal component (noise component) N generated by direct incidence of the light on the light receiving elements 3A through 3D, is reduced.

FIGS. 4A through 4C show another conventional photoreflective detector 20. FIG. 4A is a side view, FIG. 4B is a cross sectional view, and FIG. 4C is a plan view of the detector 20.

The photoreflective detector 20 includes a light emitting element 12 and a light receiving element 13 in separate chambers 11A and 11B provided in a package 11. Light from the light emitting element 12 is incident on an object 15, and the light reflected by the object 15 is incident on the light receiving element 13.

The chambers 11A and 11B are formed of a light-transmitting molding resin using the same or different molds. In either case, the chambers 11A and 11B are formed by clamping the molds. The package 11, a part of which is sandwiched between the chambers 11A and 11B is formed of a light-shielding resin to avoid light from the light emitting element 12 from being directly incident on the light receiving element 13.

The photoreflective detector 20, which includes the light emitting element 12 and the light receiving element 13 arranged horizontally, cannot be significantly reduced in size. Furthermore, since the light emitting element 12 and the light receiving element 13 need to be molded separately, the production steps increases.

As is shown in FIG. 4C, the light emitting element 12 and the light receiving element 13 are aligned along the X axis. In the case where the light receiving element 13 is divided into a plurality of areas (for example, four areas), the detection factor obtained by X-axis rotation of the object 15 is different from the detection factor obtained by Y-axis rotation of the object 15.

Such a phenomenon will be described with reference to FIGS. 5A and 5B.

FIG. 5A is a cross sectional view of the photoreflective detector 20, illustrating the change in light paths when the object 15 tilts by angle $\psi$ around the Y axis. FIG. 5B is a cross sectional view of the photoreflective detector 20, illustrating the change in light paths when the object 15 tilts by angle $\psi$ around the X axis.

In the case shown in FIG. 5A, when the object 15 is positioned parallel to the surface on which the light receiving element 13 is mounted, as represented by solid line, the light from the light emitting element 12 is incident on the object 15 at angle $\theta_1$ and reflected by the object 15 also at angle $\theta_1$ to be incident on the light receiving element 13. When the object 15 tilts at angle $\psi$ around the Y axis as represented by dashed line, the light from the light emitting element 12 is incident on and reflected by the object 15 at angle $\theta_2$.

In the case shown in FIG. 5B, when the object is positioned parallel to the surface on which the light receiving element 13 is mounted, as represented by solid line, the light from the light emitting element 12 is incident on and reflected by the object 15 at 90 degrees. When the object 15 tilts at angle ψ around the X axis as represented by dashed line, the light from the light emitting element 12 is incident on and reflected by the object 15 at angle $\theta_3$.

As appreciated from the above description, the position of the substrate 1 on which the light reflected by the object 15 is incident is different when the object 15 tilts around the Y axis from when the object 15 tilts around the X axis. As a result, the detection factor of the photoreflective detector 20 is different between these two cases. The structure shown in FIG. 1B including a plurality of light receiving elements 3A through 3D positioned around the light emitting element 2 at an equal interval solves such a problem associated with change in detection factor, but there still remains the above-described problem of reduction in S/N ratio caused by direct light incidence on the light receiving elements 3A through 3D from the light emitting element 2.

SUMMARY OF THE INVENTION

According to one aspect of the invention, a photoreflective detector includes a light emitting element; and a light receiving element located so as to receive light emitted from the light emitting element and reflected by an object. The light emitting element and the light receiving element are located to have different distances from the object so as to avoid direct incidence of the light emitted by the light emitting element on the light receiving element.

In one embodiment of the invention, a first lead frame carrying the light emitting element is located at a lower level than a second lead frame carrying the light receiving element.

In another embodiment of the invention, the second lead frame has a hole for allowing transmission of the light emitted by the light emitting element.

According to another aspect of the invention, a photoreflective detector for performing optical detection of an object includes a light emitting element mounted on a first lead frame; a light receiving element mounted on a second lead frame and located so as to receive light emitted by the light emitting element and reflected by the object, the light receiving element generating an optical output to be used for the optical detection; and a package entirely formed of a single molding resin, the package having the light emitting element and the light receiving element molded therein. The first lead frame and the second lead frame are located at two different levels in the package and project outside the package. The first lead frame or the second lead frame, outside the package, is on the same level as a surface of the second lead frame on which the light receiving element is mounted. The other lead frame, outside the package, is parallel to the surface of the second lead frame with a gap which is substantially equal to a thickness of the lead frame.

In one embodiment of the invention, a part of the first lead frame and a part of the second lead frame outside the package each have two layers, and one of the two layers of the first lead frame and one of the two layers of the second lead frame are dummy frames.

In another embodiment of the invention, the first lead frame is located below the second lead frame, and the second lead frame has a hole for allowing transmission of light emitted by the light emitting element.

In still another embodiment of the invention, the photoreflective detector further includes a light shielding and absorbing structure for shielding external light and absorbing internal leakage light on at least a part of an outer surface of the package excluding an area used for performing the optical detection.

In yet another embodiment of the invention, the light shielding and absorbing structure is provided on the entire outer surface of the package excluding the area used for performing the optical detection.

In yet another embodiment of the invention, the light shielding and absorbing structure is formed as a result of molding one of a thermoplastic resin and a thermosetting resin.

In yet another embodiment of the invention, the light shielding and absorbing structure is formed as a result of a method selected from the group consisting of coating, printing, plating and vapor deposition.

In yet another embodiment of the invention, the light shielding and absorbing structure is an irregular structure.

In yet another embodiment of the invention, the photoreflective detector further includes a reflection-preventive element on a bottom surface of at least the second lead frame.

In yet another embodiment of the invention, the reflection-preventive element is provided on the entire surfaces of the first lead frame and the second lead frame.

In yet another embodiment of the invention, the reflection-preventive element is formed as a result of a method selected from the group consisting of coating, printing, plating and vapor deposition.

According to still another aspect of the present invention, a photoreflective detector for performing optical detection of an object includes a light emitting section formed of a resin and including a first lead frame carrying a light emitting element molded therein; and a light receiving section formed of a resin and including a second lead frame carrying a light receiving element molded therein. The light emitting section and the light receiving section are stacked in such a manner that light emitted by the light emitting element is reflected by the object to be incident on the light receiving element to cause the light receiving element to generate an optical output used for optical detection.

In one embodiment of the invention, the light emitting section is located at a lower level than the light receiving section, and the second lead frame has a hole for allowing transmission of the light emitted by the light emitting element.

In another embodiment of the invention, the photoreflective detector further includes a container for containing the light emitting section and the light receiving section; and a light-shielding resin element on at least a part of an outer surface of the container excluding an area used for the optical detection.

In still another embodiment of the invention, the light-shielding resin element is provided on the entire outer surface of the container excluding the area used for the optical detection.

In yet another embodiment of the invention, the photoreflective detector further has a through-hole extending from a top surface of the light receiving section to a top surface of the light emitting section.

In yet another embodiment of the invention, the photoreflective detector further includes a package formed of a molding resin, the package having the light emitting element and the light receiving element molded therein; and a light shielding and absorbing structure for shielding external light and absorbing internal leakage light on at least a part of an outer surface of the package excluding an area used for performing the optical detection.

In yet another embodiment of the invention, the light shielding and absorbing structure is provided on the entire outer surface excluding the area used for performing the optical detection.

In yet another embodiment of the invention, the light shielding and absorbing structure is formed as a result of molding one of a thermoplastic resin and a thermosetting resin.

In yet another embodiment of the invention, the light shielding and absorbing structure is formed as a result of a method selected from the group consisting of coating, printing, plating and vapor deposition.

In yet another embodiment of the invention, the light shielding and absorbing structure is an irregular structure.

According to yet another aspect of the present invention, a method for producing a photoreflective detector includes the steps of stacking a first lead frame sheet and a second lead frame sheet, and securing the lead frame sheets by a pin; and clamping the stacked first and second lead frame sheets by a mold so as to allow no space between the first lead frame sheet and the second lead frame sheet in at least an area of inner lead portions inside tie bars.

Thus, the invention described herein makes possible the advantages of (1) providing a photoreflective detector for improving the S/N ratio as a result of preventing direct light incidence on a light receiving element from a light emitting element and restricting difference in detection factor in accordance with the tilt direction of the object; and (2) providing a method for producing such a photoreflective detector.

These and other advantages of the present invention will become apparent to those skilled in the art upon reading and understanding the following detailed description with reference to the accompanying figures.

BRIEF DESCRIPTION OF THE DRAWINGS

FIG. 15A is a plan view of a lead frame sheet used for producing the photoreflective detector shown in FIG. 12;

FIG. 15B is a side view of the lead frame shown in FIG. 15A;

FIG. 16A is a plan view of another lead frame sheet used for producing the photoreflective detector shown in FIG. 12;

FIG. 16B is a side view of the lead frame shown in FIG. 16A;

FIG. 17A is a plan view of the lead frame sheets shown in FIGS. 15A and 16A in the state of being stacked;

FIG. 17B is a side view of the lead frame sheets shown in FIG. 17A;

FIG. 18A is a plan view of the lead frame sheets shown in FIGS. 15A and 16A in the state of being stacked and molded;

FIG. 18B is a side view of the lead frame sheets shown in FIG. 18A;

FIG. 18C is a top view of an individual photoreflective detector;

DESCRIPTION OF THE PREFERRED EMBODIMENTS

Hereinafter, the present invention will be described by way of illustrative examples with reference to the accompanying drawings.

Example 1

A photoreflective detector 100 in a first example according to the present invention will be described with reference to FIGS. 6, 7, 8A and 8B. The photoreflective detector 100 acts as a photointerruptor.

Figure 1A:
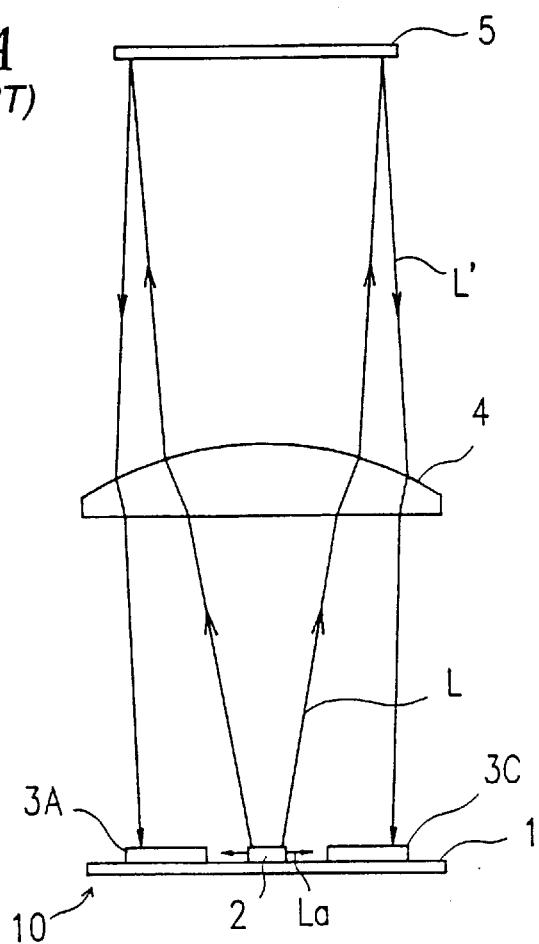
FIG. 1A is a cross sectional view of a conventional photoreflective detector.
Figure 1B:
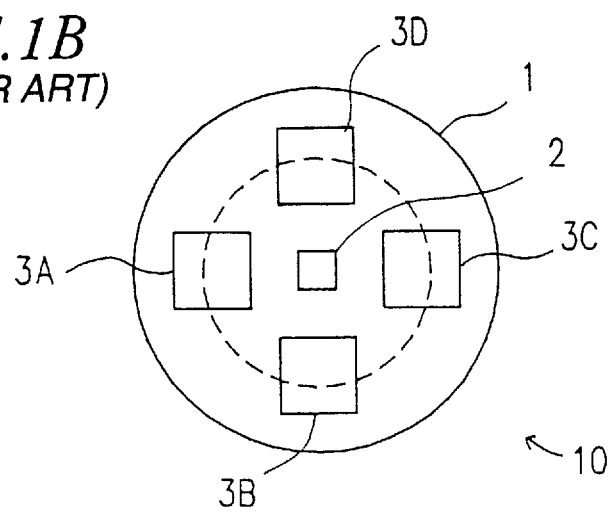
FIG. 1B is a plan view of the photoreflective detector shown in FIG. 1A.
Figure 2A:
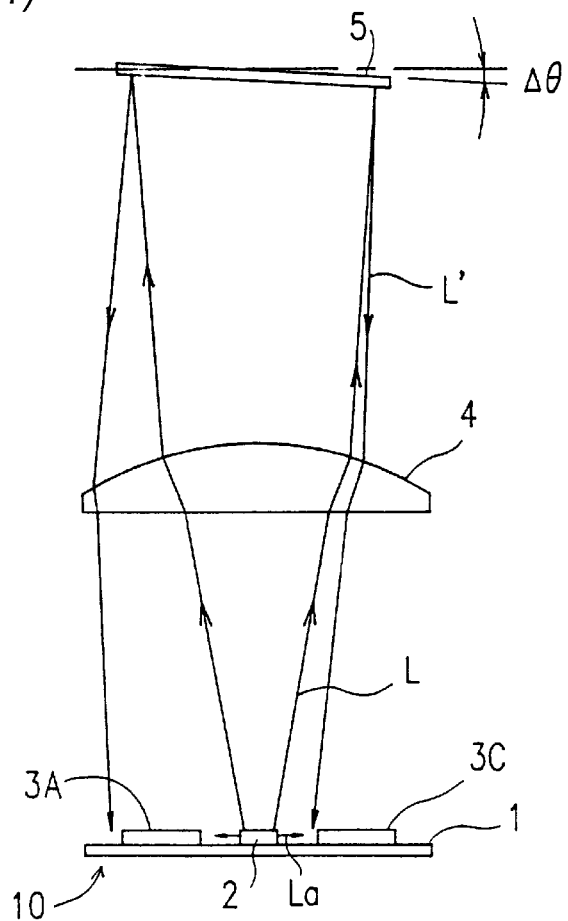
FIG. 2A is a cross sectional view of the conventional photoreflective detector shown in FIG. 1A, illustrating a light path in the case where an object is tilted.
Figure 2B:
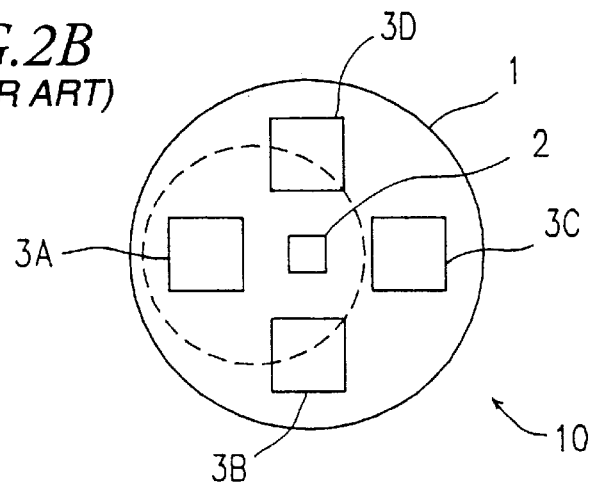
FIG. 2B is a plan view of the photoreflective detector in the state shown in FIG. 2A.
Figure 3:
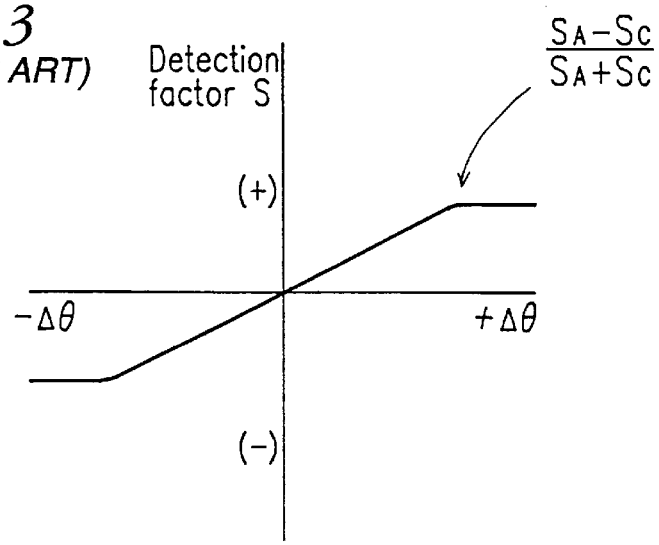
FIG. 3 is a graph illustrating the detection factor of the conventional photoreflective detector shown in FIG. 1 by a function of the tilt angle.
Figure 4A:
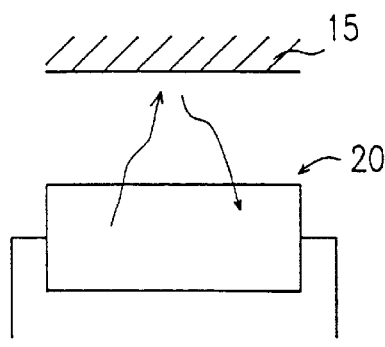
FIG. 4A is a side view of another conventional photoreflective detector.
Figure 4B:
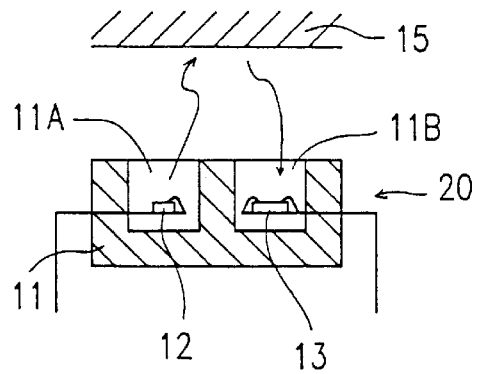
FIG. 4B is a cross sectional view of the photoreflective detector shown in FIG. 4A.
Figure 4C:
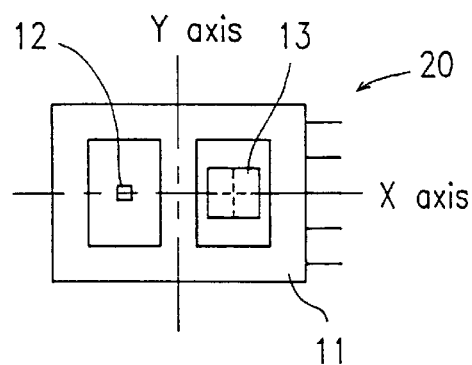
FIG. 4C is a top view of the photoreflective detector shown in FIG. 4A.
Figure 5A:
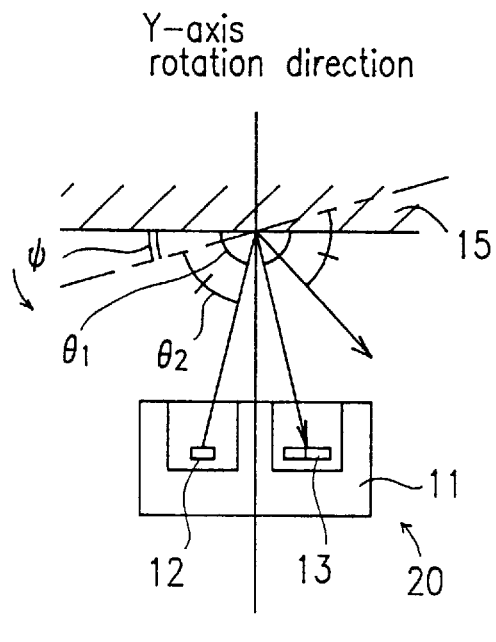
FIG. 5A is a cross sectional view of the photoreflective detector shown in FIG. 4A, illustrating a light path in the case where the object rotates around the Y axis.
Figure 5B:
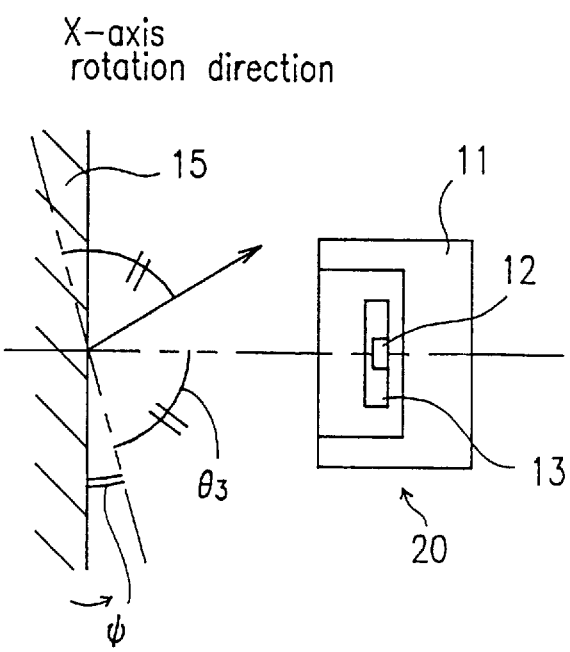
FIG. 5B is a cross sectional view of the photoreflective detector shown in FIG. 4A, illustrating a light path in the case where the object rotates around the X axis.
Figure 6:
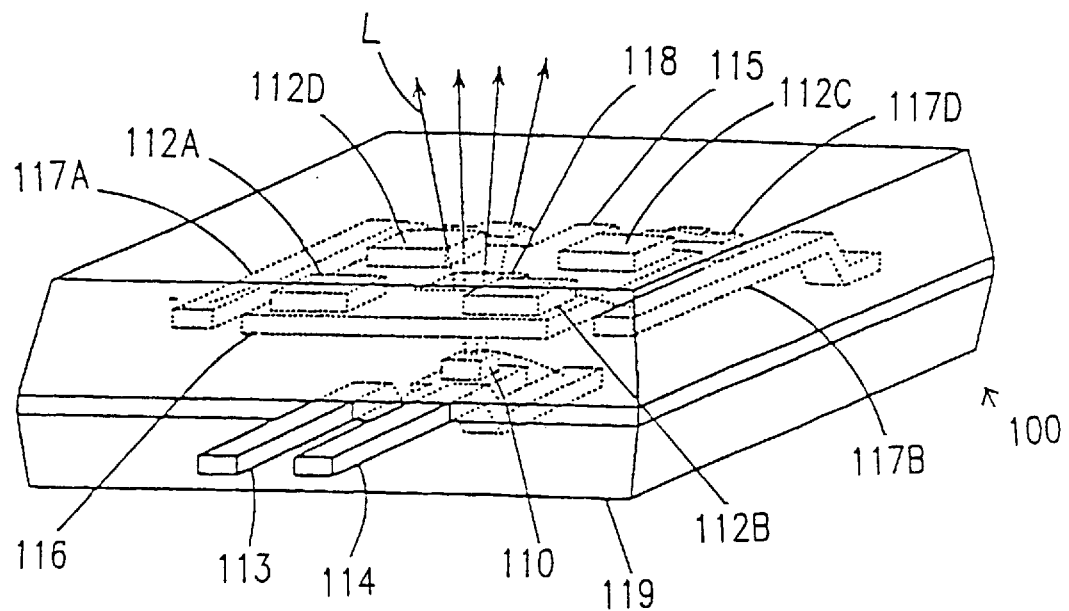
FIG. 6 is an isometric view of a photoreflective detector in a first example according to the present invention.
Figure 7:
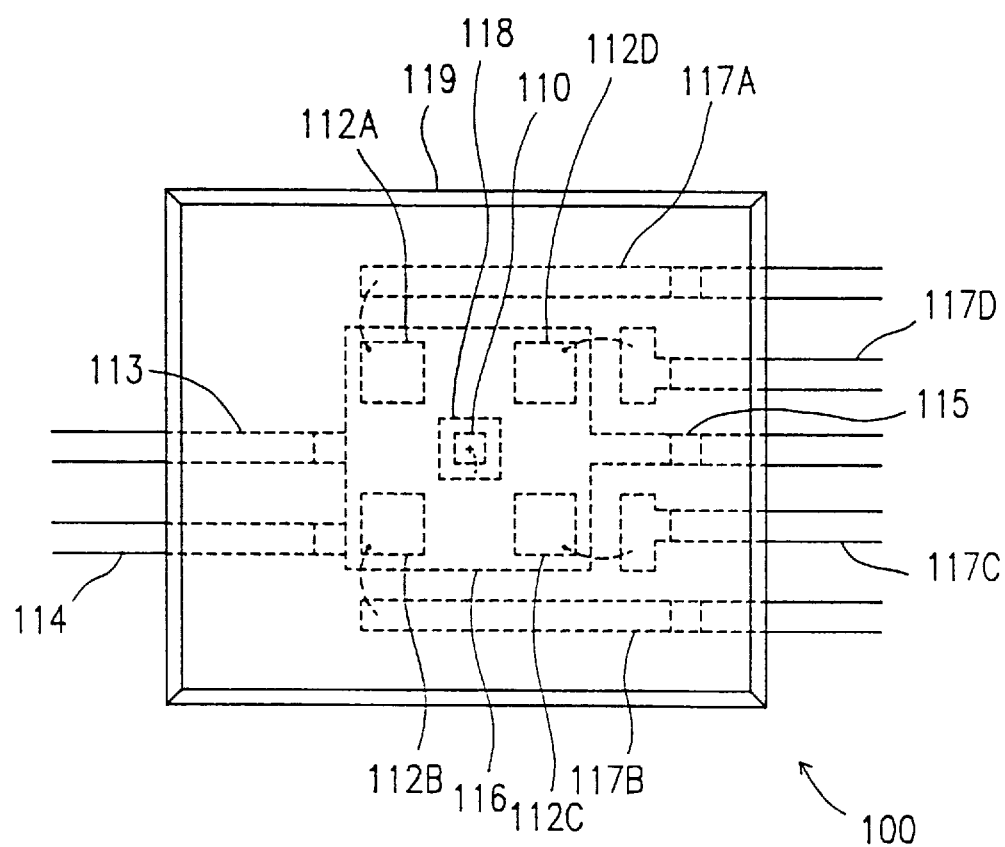
FIG. 7 is a top view of the photoreflective detector shown in FIG. 6.
Figure 8A:
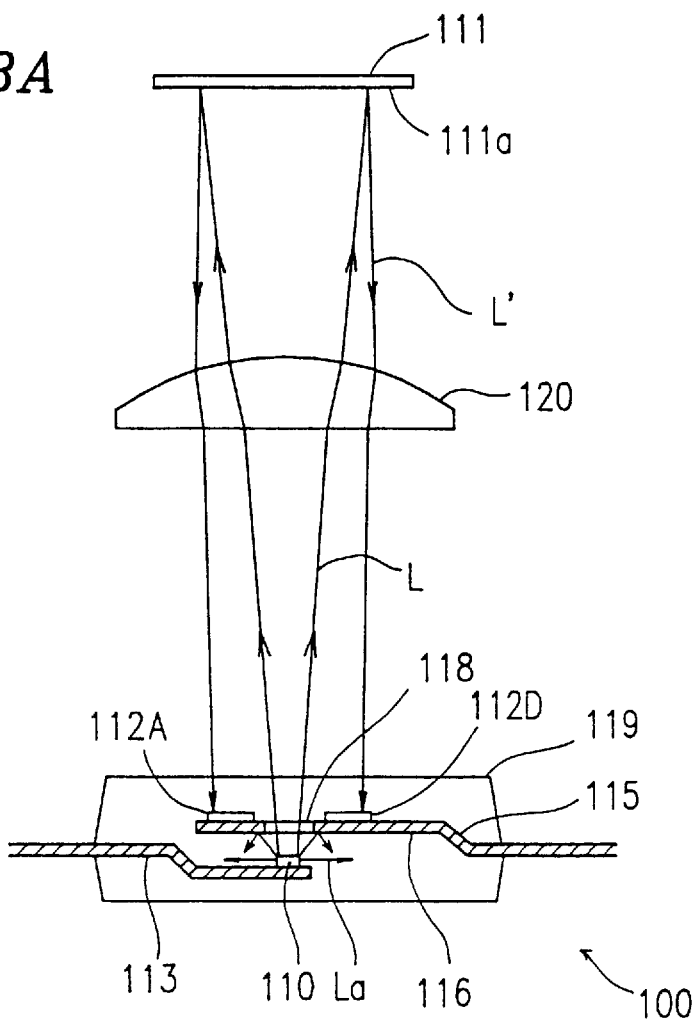
FIG. 8A is a cross sectional view of the photoreflective detector shown in FIG. 6, illustrating a light path in the case where the object is parallel to light receiving elements.
Figure 8B:
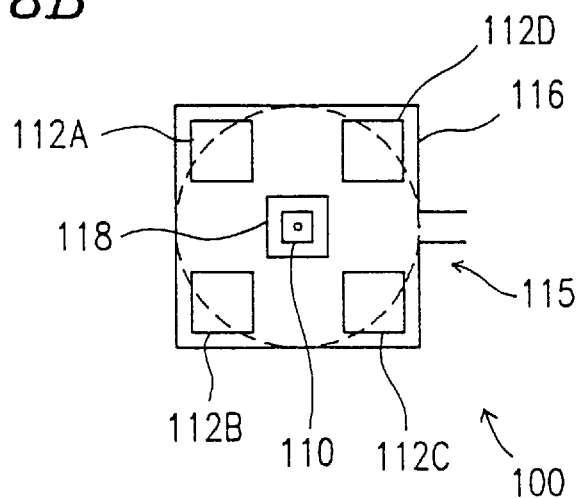
FIG. 8B is a top view of the photoreflective detector shown in FIG. 8A.

FIG. 6 is an isometric view of the photoreflective detector 100, and FIG. 7 is a plan view thereof. FIGS. 8A and 8B are respectively a schematic cross sectional view and a schematic plan view, illustrating tilt detection (i.e., detection of tilt direction and angle) of an object 111 performed by the photoreflective detector 100.

As is best illustrated in FIG. 8A, light L emitted by a light emitting element 110 is reflected by the object 111, and the reflected light L' is received by light receiving elements 112A through 112D (FIG. 8B). The light emitting element 110 and the light receiving elements 112A through 112D oppose the object 111, and the distance between the light emitting element 110 and the object 111 is longer than the distance between each of the light receiving elements 112A through 112D and the object 111.

The light emitting element 110 (for example, an LED) is die-bonded to a tip of a lead frame 113 provided for carrying the light emitting element 110 and is wire-bonded to a lead frame 114 (FIG. 6) provided for connection with the light emitting element 110. As illustrated in FIG. 7, the four light receiving elements 112A through 112D (for example, phototransistors or photodiodes) are respectively positioned at four corners of a square table 116 provided at a tip of a lead frame 115 provided for carrying the light receiving elements 112A through 112D and are respectively wire-bonded to lead frames 117A through 117D provided for connection with the light receiving elements 112A through 112D.

As illustrated in FIG. 8A, the lead frame 113 is positioned below the lead frame 115 at a prescribed distance so that the light emitting element 110 is right below the center of the table 116 (i.e., the light emitting element 110 is aligned with the center of the table 116 in the direction perpendicular to the surface of the table 116). The table 116 has a square hole 118 at the center thereof, the hole 118 having a larger area than the surface area of the light emitting element 110. The hole 118 is not limited to square but may be polygonal or circular.

As appreciated from the above description, the photoreflective detector 100 has a two-story structure in which the light emitting element 110 is farther from the object 111 than the light receiving elements 112A through 112D.

Referring to FIG. 6 again, the light emitting element 110 and the light receiving elements 112A through 112D located in this manner are molded in a package 119 which is formed of a transparent resin such as an epoxy resin by transfer molding. The lead frames 113 and 114 associated with the light emitting element 110 project outward from a side surface of the package 119, and the lead frames 115 and 117A through 117D associated with the light receiving elements 112A through 112D project outward from another side surface of the package 119 (FIG. 7). The lead frames 113, 114, 115 and 117A through 117D are bent so as to be stepped in the package 119 so as to project from the side surfaces at the same level (FIG. 6).

The package 119 is accommodated in a holder (not shown). A convex lens 120 integrally molded with the holder is provided above the package 119 (FIG. 8A). The lead frame 114 connected to the light emitting element 110 is connected to a driving circuit (not shown), and the lead frames 117A through 117D connected to the light receiving elements 112A through 112D are connected to an A/D converter (not shown) via a signal processing circuit (not shown).

The object 111 opposing the light receiving elements 112A through 112D is supported so as to be tilted by a load applied in two-dimensional direction. In practice, the photoreflective detector 100 is located in the object 111, for example, a hollow stick. An inner face of a top surface of the stick, for example, acts as a reflective face 111a. Movement of the object 111 can be detected two-dimensionally in such a position. The photoreflective detector 100 having such a structure can be used for a pointing device for outputting data to a display apparatus of a computer or the like.

With reference to FIGS. 8A, 8B, 9A and 9B, such a function of the photoreflective detector 100 will be described in detail.

FIGS. 8A and 8B show a light path realized in the photoreflective detector 100 when the object 111 is positioned parallel to the surface of the table 116 on which the light receiving elements 112A through 112D are mounted.

When light is emitted by the light emitting element 110 where the object 111 is positioned as is shown in FIG. 8A, a part of light propagating upward from the light emitting element 110 (light L) transmits through the hole 118 in the lead frame 115 and is incident on the lens 120. The light L is then collected by the lens 120 and is incident on the object 111. The light L' reflected by the object 111 is collected again by the lens 120, and as is shown in FIG. 8B, a circular image having the light emitting element 110 as the center is formed on the table 116 as represented by dashed line. As is appreciated from FIG. 8B, the reflected light L' is incident on the light receiving elements 112A through 112D uniformly, and therefore the optical outputs from the light receiving elements 112A through 112D have an equal level to one another.

The rest of the light emitted by the light emitting element 110 is reflected by a bottom surface of the lead frame 115 to propagate downward and goes out of the package 119 without being directed to the object 111. Light La emitted from the side surfaces of the light emitting element 110 goes out of the package 119 directly or after being reflected by the lead frame 115. Thus, the light which is not related to the tilt detection is shielded by the lead frame 115 without being incident on any of the light receiving elements 112A through 112D.

Figure 9A:
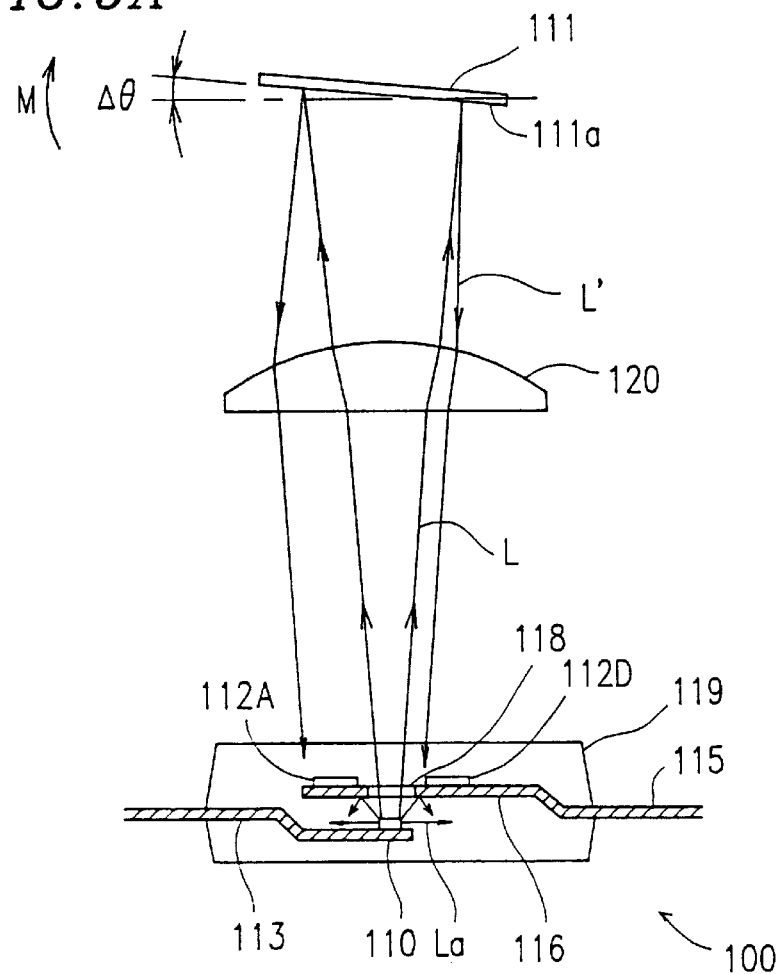
FIG. 9A is a cross sectional view of the photoreflective detector shown in FIG. 6, illustrating a light path in the case where the object is tilted.
Figure 9B:
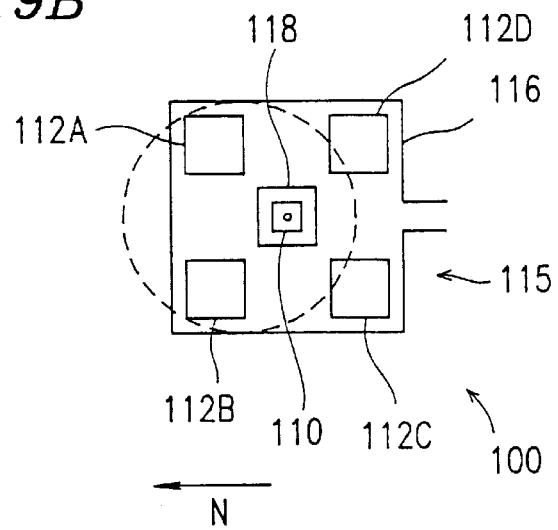
FIG. 9B is a top view of the photoreflective detector in the state shown in FIG. 9A.

FIGS. 9A and 9B are respectively a cross sectional view and a plan view of the photoreflective detector 100, illustrating a light path realized when the object 111 (for example, the joystick) is tilted at AB with respect to the table 116 on which the light emitting elements 112A through 112D are mounted.

When the object 111 tilts as is shown in FIG. 9A, the position of an image formed by the reflected light L' on the lead frame 115 moves as is shown in FIG. 9B in accordance with the tilt angle. For example, if the object 111 tilts in the direction indicated by arrow M (direction M), the position of the image moves in the direction indicated by arrow N (FIG. 9B). As a result, the optical outputs from the light receiving elements 112A through 112D have different levels from one another.

Based on output signals $S_A$ through $S_D$ from the light receiving elements 112A through 112D, detection factor $S_1$ is found using expression (2) by the signal processing circuit.

$$S_1 = \{(S_A + S_B) - (S_C + S_D)\} / (S_A + S_B + S_C + S_D) \quad (2)$$

Figure 10:
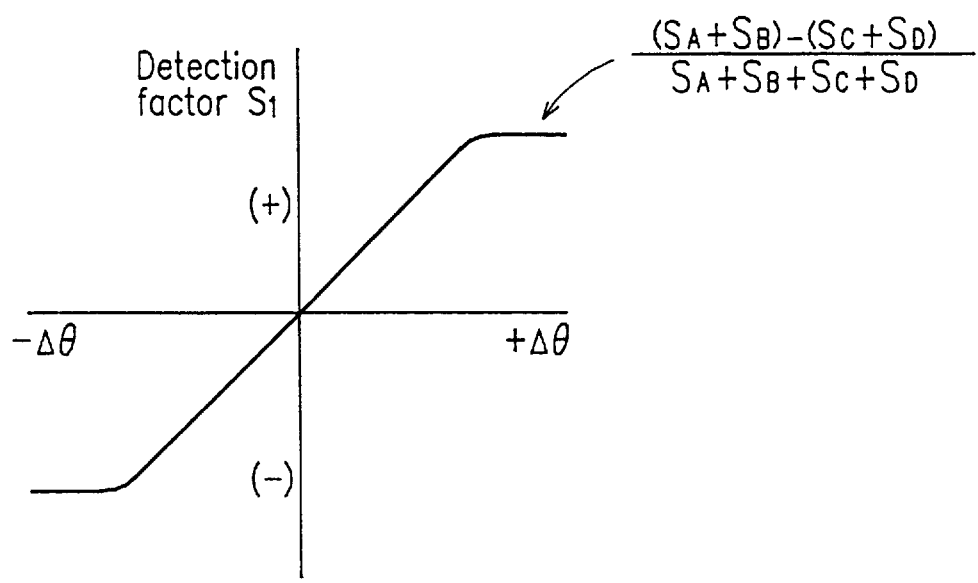
FIG. 10 is a graph illustrating the detection factor of the photoreflective detector shown in FIG. 6 by a function of the tilt angle.

FIG. 10 shows detection factor $S_1$ obtained by expression (2) by a function of tilt angle $\Delta\theta$. Detection factor $S_1$ changes linearly with respect to tilt angle $\Delta\theta$ in a certain range of angles. In such a range, tilt angle $\Delta\theta$ can be detected based on detection factor $S_1$.

Similarly, when the object 111 tilts in a direction perpendicular to direction M can be found by expression (3), and tilt angle $\Delta\theta$ can be obtained based on detection factor $S_2$.

$$S_2 = \{(S_A + S_D) - (S_B 30\ S_C)\} / (S_A + S_B + S_C + S_D) \quad (3)$$

Based on detection factors $S_1$ and $S_2$ obtained in this manner, the tilt directions and angles of the object 111 in response to a load applied thereto can be found. Thus, the direction and distance by which a cursor or the like is to be moved on a screen of a display apparatus in accordance with the tilt direction and angle of the object 111 are determined.

As is described above, the light which is not involved in tilt detection is prohibited from being incident on any of the light receiving elements 112A through 112D. Therefore, the light receiving elements 112A through 112D do not output data corresponding to such light. Compared to the case in which the unrelated light is detected, the numerators ($S_A + S_B$)−($S_C + S_D$) (expression (2)) and ($S_A + S_D$)−($S_B + S_C$) (expression (3)) indicating the difference in outputs between the light receiving elements 112A through 112D remain the same, whereas the denominator ($S_A + S_B + S_C + S_D$) indicating the total of the outputs from the light receiving elements 112A through 112D is reduced. Accordingly, the detection factor of the photoreflective detector 100 is higher than the detection factor in the conventional photoreflective detector. The S/N ratio increases to about ten times, thus improving the detection precision of the photoreflective detector 100.

In this example, the photoreflective detector 100 includes four light receiving elements 112A through 112D for performing two-dimensional tilt detection of the object 111. If one-dimensional tilt detection is required, the photoreflective detector can include two light receiving elements. In such a case, the two light receiving element can be located symmetrically to each other with the hole 118 in the lead frame 115 as the center.

The photoreflective detector 100 can be used for detecting the movement or the moving distance of the object 111 as well as the tilt.

Figure 11A:
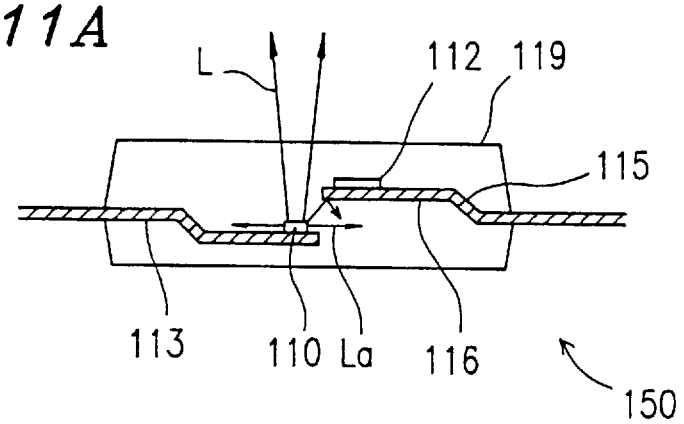
FIG. 11A is a cross sectional view of a photoreflective detector in a modification of the first example according to the present invention.

The photoreflective detector functions properly as long as the light from the light emitting element 110 is not directly incident on the light receiving elements 112A through 112D. Accordingly, the photoreflective detector 100 can be modified into a photoreflective detector 150 (FIG. 11A) or 160 (FIG. 11B). d In the photoreflective detector 150 in FIG. 11A, the light emitting element 110 is not right below the center of the table 116, but is positioned not to be overlapped by the lead frame 115. The light emitting element 110 still opposes the object (not shown) and is below the light receiving elements 112. Formation of the hole 118 in the lead frame 115 can be eliminated.

Figure 11B:
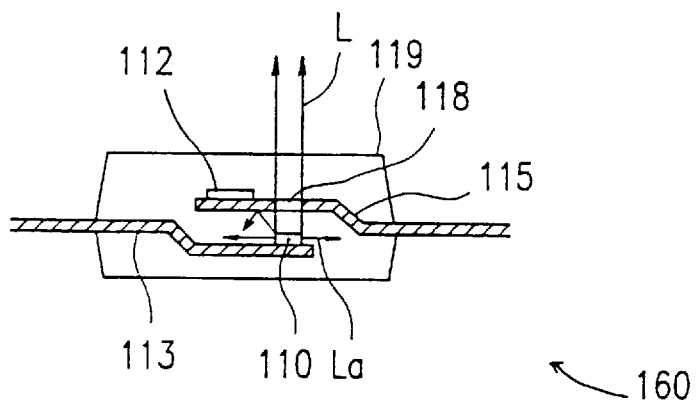
Figure 11B is a cross sectional view of a photoreflective detector in another modification of the first example according to the present invention.

In the photoreflective detector 160 in FIG. 11B, the light emitting element 110 is not right below the center of the table 116 but still is overlapped by the lead frame 115. The hole 118 is formed in the lead frame 115, at a position corresponding to the light emitting element 110.

In either photoreflective detector 150 or 160, if a two-dimensional PSD (position sensing device) or a divided photodiode is used as the light receiving element 112, one light receiving element 112 can perform two-dimensional movement detection. Due to such a structure, the area of the lead frame 115 on which the light receiving element 112 is mounted can be reduced to realize a sufficiently small photoreflective detector. In the case where one light receiving element 112 is used, the light emitting element 110 and the light receiving element 112 are positioned so that the distance between the light emitting element 110 and the object is different from the distance between the light receiving element 112 and the object. The light emitting element 110 can be located closer to the object than the light receiving element 112, namely, above the light emitting element 110, as long as the light emitting element 110 does not obstruct light reception by the light receiving element 112. Even in such a structure, the light from the light emitting element 110 is not directly incident on the light receiving element 112.

In the above description, the light emitting element 110 and the light receiving element 112 are mounted on different lead frames. The light emitting element 110 and the light receiving element 112 can be mounted on the same lead frame. In such a case, the lead frame is bent so as to be stepped so that either the light emitting element 110 or the light receiving element 112 is mounted at a higher or lower level than the other.

Example 2

Figure 12:
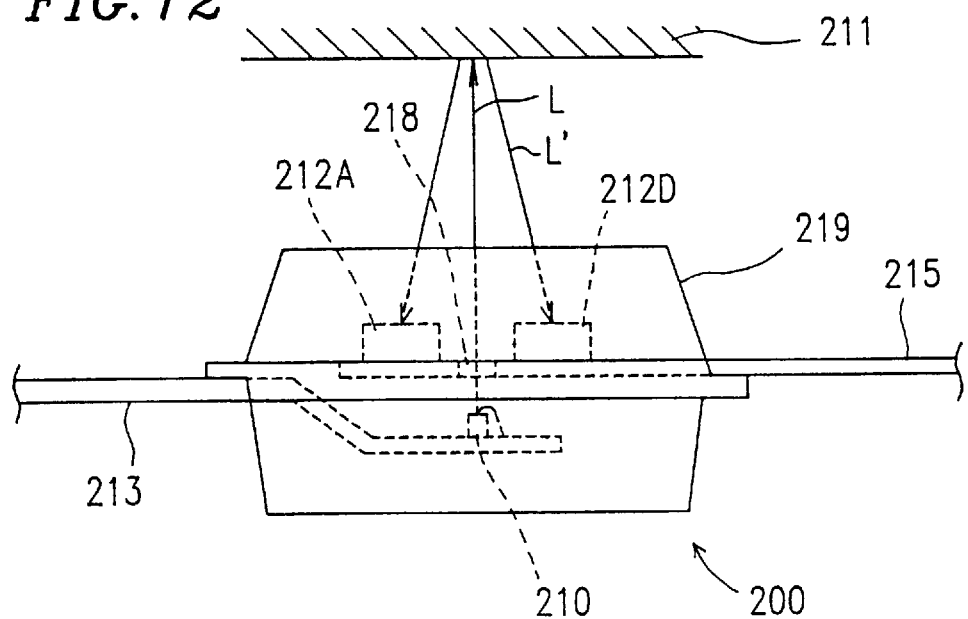
FIG. 12 is a side view of a photoreflective detector in a second example according to the present invention.
Figure 13:
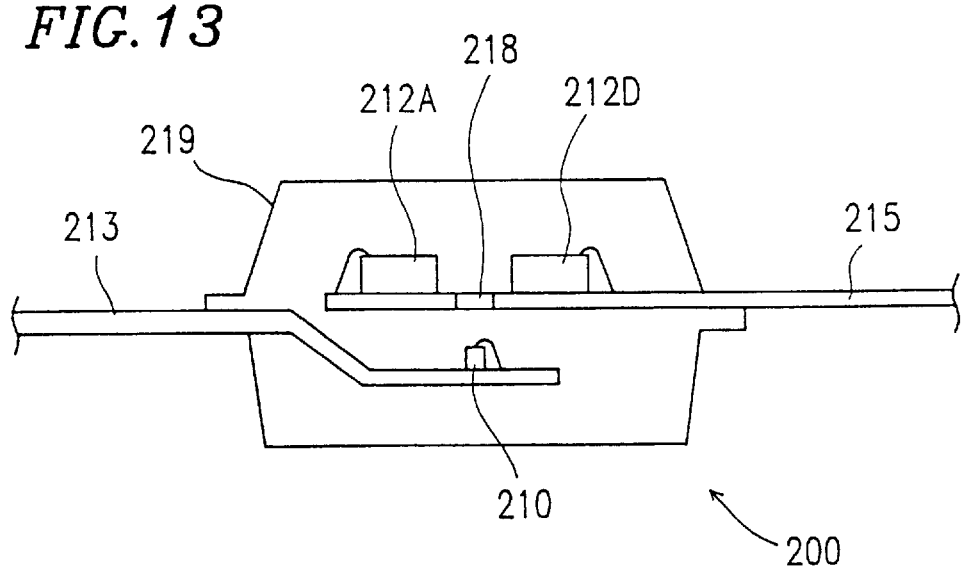
FIG. 13 is a cross sectional view of the photoreflective detector shown in FIG. 12.
Figure 14:
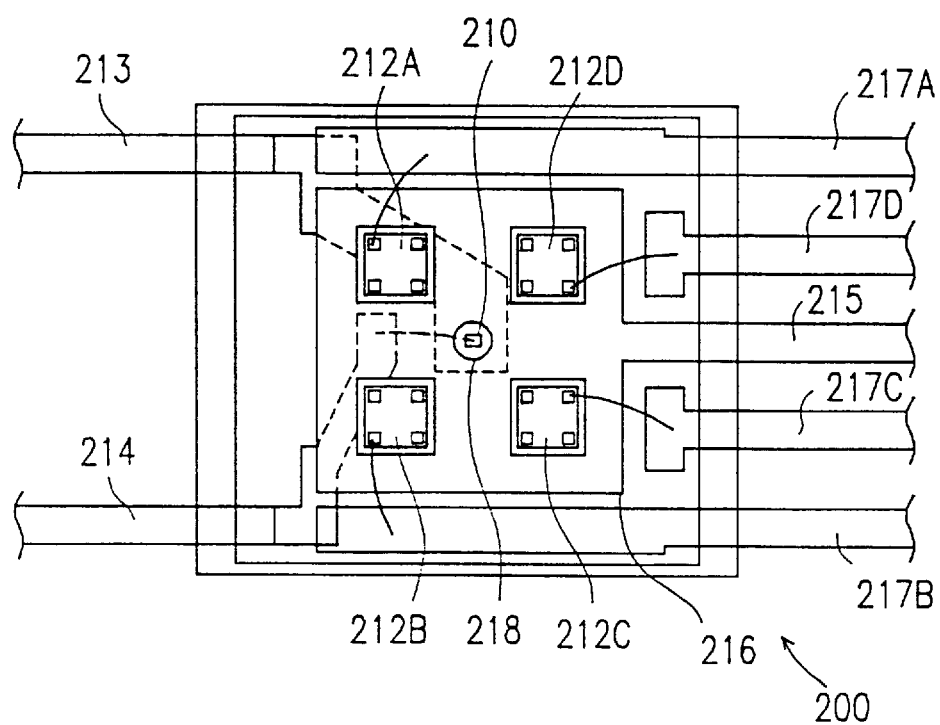
FIG. 14 is a top view of the photoreflective detector shown in FIG. 12.

With reference to FIGS. 12 through 14, a photoreflective detector 200 in a second example according to the present invention will be described.

FIG. 12 is a side view of the photoreflective detector 200, FIG. 13 is a cross sectional view thereof, and FIG. 14 is a plan view thereof.

As is best illustrated in FIG. 12, light L emitted by a light emitting element 210 is reflected by an object 211, and the reflected light L' is received by light receiving elements 212A through 212D (FIG. 14). The existence, position, and tilt direction and angle of the object 211 are detected based on the difference in outputs from the light receiving elements 212A through 212D.

As shown in FIG. 14, the light emitting element 210 (for example, an LED) is die-bonded to a tip of a lead frame 213 provided for carrying the light emitting element 210 and is wire-bonded to a lead frame 214 provided for connection with the light emitting element 210. The four light receiving elements 212A through 212D (for example, phototransistors or photodiodes) are respectively positioned at four corners of a square table 216 provided at a tip of a lead frame 215 provided for carrying the light receiving elements 212A through 212D and are respectively wire-bonded to lead frames 217A through 217D provided for connection with the light receiving elements 212A through 212D.

As illustrated in FIGS. 12 and 13, the lead frame 213 is located below the lead frame 215 and is formed so that the light emitting element 210 is right below the center of the table 216. The table 216 has a circular hole 218 at the center thereof, the hole 218 having a larger area than the surface area of the light emitting element 210. The hole 218 is not limited to be circular but may be polygonal.

As is appreciated from the above description, the photoreflective detector 200 has a two-story structure in which the light emitting element 210 is farther from the object 211 than the light receiving elements 212A through 212D.

The number of the light receiving elements is not limited to four, but may be one or any other number.

The light emitting element 210 and the light receiving elements 212A through 212D located in this manner are molded in a package 219 which is formed of a transparent resin such as an epoxy resin by transfer molding. The light emitting element 210 and the light receiving elements 212A through 212D are molded without being separated as in the conventional photoreflective detector 20.

As shown in FIGS. 12 and 13, the lead frames 213 and 214 (FIG. 14) associated with the light emitting element 210 project outward from a side surface of the package 219, and the lead frames 215 and 217A through 217D (FIG. 14) associated with the light receiving elements 212A through 212D project outward from another side surface of the package 219. The lead frames 213, 214, 215 and 217A through 217D are bent so as to be stepped in the package 219 so that the lead frames 213 and 214 are parallel to but lower than the lead frames 215 and 217A through 217D by the thickness of the lead frame 215 outside the package 219. Alternatively, the lead frame 215 can be lower than the lead frame 213 by the thickness of the lead frame 213.

The package is accommodated in a holder (not shown). A convex lens (not shown) integrally molded with the holder is provided above the package 219. The lead frame 214 connected to the light emitting element 210 is connected to a driving circuit (not shown), and the lead frames 217A through 217D connected to the light receiving elements 212A through 212D are connected to an A/D converter (not shown) via a signal processing circuit (not shown).

With reference to FIGS. 15A, 15B, 16A, 16B, 17A and 17B, the lead frame 213 for carrying the light emitting element 210 and the lead frame 215 (FIG. 14) for carrying the light receiving elements 212A through 212D will be described in detail.

FIG. 15A is a plan view of a lead frame sheet 213A, and FIG. 15B is a side view thereof. FIG. 16A is a plan view of a lead frame sheet 213B, and FIG. 16B is a side view thereof. The lead frame sheet 213A is cut into a plurality of lead frames 213, and the lead frame sheet 215A is cut into a plurality of lead frames 215. FIG. 17A is a plan view of the lead frame sheets 213A and 215A stacked and set in a mold. FIG. 17B is a side view thereof. The mold is represented by reference numeral 241 in FIG. 17B.

As is shown in FIG. 15A, the lead frame sheet 213A has reference holes 231 for positioning the mold and polygonal holes 232 for ventilation. As is shown in FIG. 16A, the lead frame sheet 215A has reference holes 251 for positioning the mold and polygonal holes 252 for ventilation. As is shown in FIG. 17B, a reference pin 242 is inserted into corresponding holes 231 and 251 to stack the lead frame sheets 213A and 215A. The lead frame sheets 213A and 215A are set in the mold 241 in such a state. In the case when the lead frame sheets 213A and 215A are clamped by the mold 241, the lead frame sheets 213A and 215A are stacked so that there is no substantial gap in at least a part of the area between tie bars 233 and 253, for example, inside clamping positions 243 (hatched area in FIG. 17A). By eliminating the gap in this manner, leakage of a molding resin 245 (FIG. 18A) during the molding process performed using the mold 241 is prevented.

FIGS. 18A is a plan view of the lead frame sheets 213A and 215A. in the state of completely filled with the molding resin 245. FIG. 18B is a side view thereof, and FIG. 18C is a plan view of the photoreflective detector 200 in the completed form. Reference numerals 246 (FIG. 18A) and 247 (FIG. 18C) denote traces of ejector pins used for releasing the mold 241.

Due to the position of the runner of the mold used for transfer molding, the reference pin 242 needs to be inserted into the lead frame sheets 213A and 215A using the reference holes 231 and 251. For such operation, it is preferable to stack the lead frame sheets 213A and 215A when the lead frame sheets 213A and 215A are set in the mold 241. In the case where the molding resin 245 is transparent, even if there is a gap of only several tens of micrometers between the lead frame sheets 213A and 215A, the resin 245 leaks to make burrs at positions represented by reference numeral 248 in FIG. 18A. In order to solve such a problem, the lead frames 213A and 215A need to be clamped by the mold 241 so as to leave substantially no gap therebetween. Such a manner of clamping is realized by the structure and method described in this example.

Example 3

In a third example, further improvement of the photoreflective detector 200 in the second example will be described.

Figure 19:
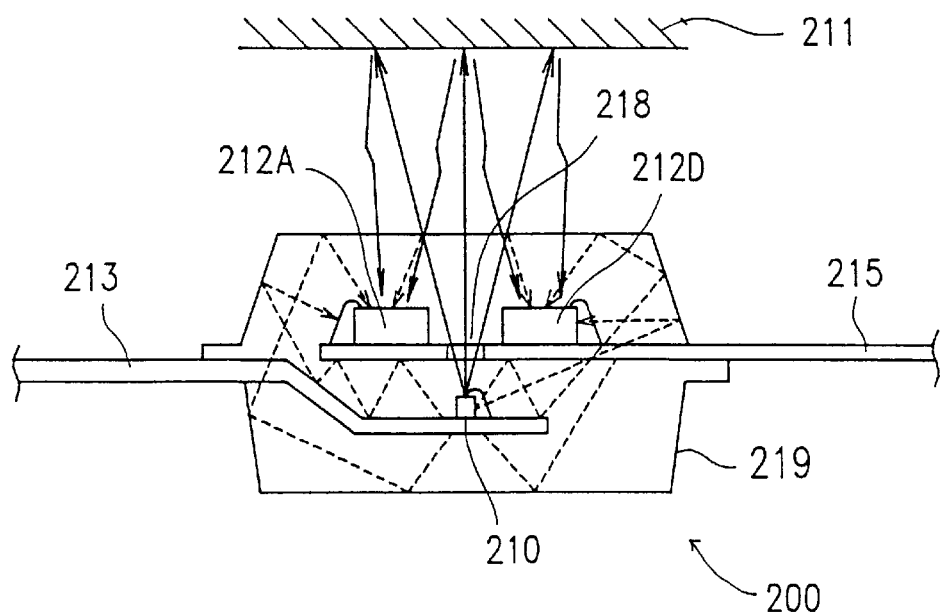
FIG. 19 is a cross sectional view of the photoreflective detector shown in FIG. 12, illustrating paths light emitted by a light emitting element.

FIG. 19 is a cross sectional view of the photoreflective detector 200 in the second example, illustrating paths of light emitted by the light emitting element 210.

In FIG. 19, solid lines represent a path of light emitted by the light emitting element 210 and reflected by the object 211 to be incident on light receiving elements 212A through 212D, and dashed lines represent paths of light emitted by the light emitting element 210 and reflected by an inner face of the package 219 or surfaces of lead frames 213 and 215 to be incident on the light receiving elements 212A through 212D. The light reflected by the object 211 acts as signal component S, and the light reflected by the package 219 or the lead frames 213 and 215 acts as internal leak noise component N. As the S/N ratio, which is the ratio of signal component S with respect to noise component N, is higher, the performance of the photoreflective detector is better. In other words, as the S/N ratio is higher, a larger design margin $\Delta V$ from the threshold voltage is obtained in detecting the existence of the object 211. This will be described in detail.

Figure 20A:
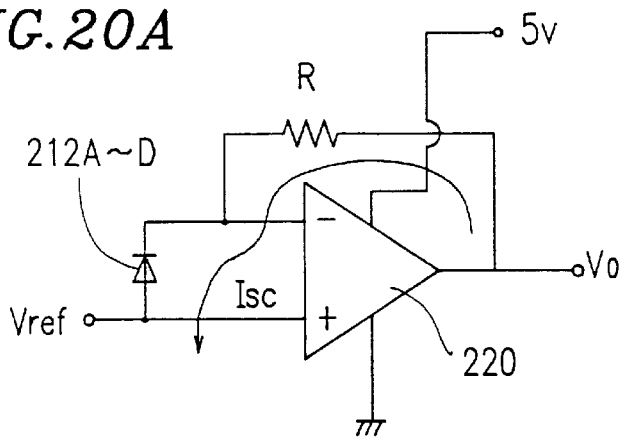
FIG. 20A is a circuit diagram of an output amplifier used in the photoreflective detector shown in FIG. 19.

FIG. 20A is a circuit diagram of an output amplifier used when the light receiving elements 212A through 212D are photodiodes.

As is shown in FIG. 20A, the output amplifier includes an operational amplifier 220. A non-inverting input of the operational amplifier 220 is supplied with a reference voltage Vref. Each of light receiving elements 212A through 212D is connected between the non-inverting input and an inverting input of the operational amplifier 220. A resistor R is connected between the inverting input and an output of the operational amplifier 220.

When the light receiving elements 212A through 212D receive light and become conductive, a current Isc flows through the resistor R and the light receiving elements 212A through 212D, thereby causing voltage drop Isc·R between the reference voltage Vref and the output voltage Vo of the operational amplifier 220. It should be noted that the voltage drop is considered in terms of the absolute value. Since the level of the current Isc is determined by the amount of light received by the light receiving elements 212A through 212D, the level of the voltage drop Isc·R depends on the level of output signals from the light receiving elements 212A through 212D. Hereinafter, the level of voltage drop will be referred to as an "output signal width $\Delta Vo$" of the light receiving element. The output signal from the operational amplifier 220 represented by expression (4) is the signal obtained by amplifying the output signal from each of the light receiving element 212A through 212D.

$$Vo=Vref-Isc \cdot R \tag{4}$$

As described above, the light emitting elements 212A through 212D each receive the light acting as the noise component N as well as the light acting as signal component S. Output Vo(S) corresponding to signal component S and output Vo(N) corresponding to noise component N are represented by expressions (5) and (6), respectively.

$$Vo(S)=Vref-Isc(S) \cdot R \tag{5}$$

$$Vo(N)=Vref-Isc(N) \cdot R \tag{6}$$

Figure 20B:
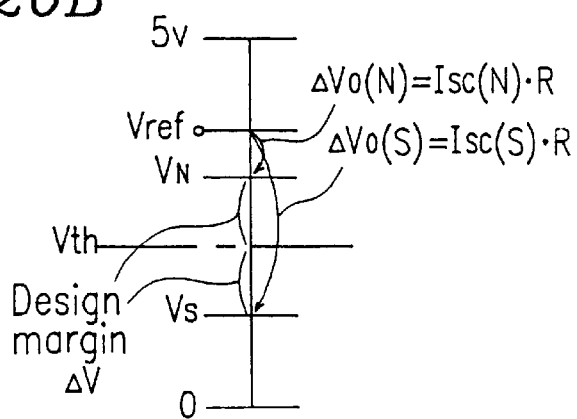
FIG. 20B is a view schematically showing voltage levels in the photoreflective detector shown in FIG. 19.

The output signal width of the light receiving element with respect to signal component S expressed by $\Delta Vo(S)=Isc(S) \cdot R$ always includes the output signal width of the light receiving element with respect to noise component $\Delta Vo(N)=Isc(N) \cdot R$. As the value of $\Delta Vo(S)/\Delta Vo(N)$ increases, the light receiving element is less influenced by noise component N during signal processing. As is shown in FIG. 20B, when setting threshold level Vth between noise voltage level $V_N$ (which is lower than reference voltage Vref by the output signal width of the light receiving element with respect to noise component ($\Delta Vo(N)$) and signal voltage level $V_S$ (which is lower than reference voltage Vref by the output signal width of the light receiving element with respect to signal component ($\Delta Vo(S)$), as the value of $\Delta Vo(S)/\Delta Vo(N)$ becomes larger, the difference between noise voltage level $V_N$ and signal voltage level $V_S$ increases. Therefore, the design margin $\Delta V$, which is the difference between noise voltage level $V_N$ and threshold level Vth and the difference between signal voltage level $V_S$ and threshold level Vth, can increase.

By controlling the noise component caused by internal light leakage in this manner, the performance of the photoreflective detector can be improved.

Figure 21:
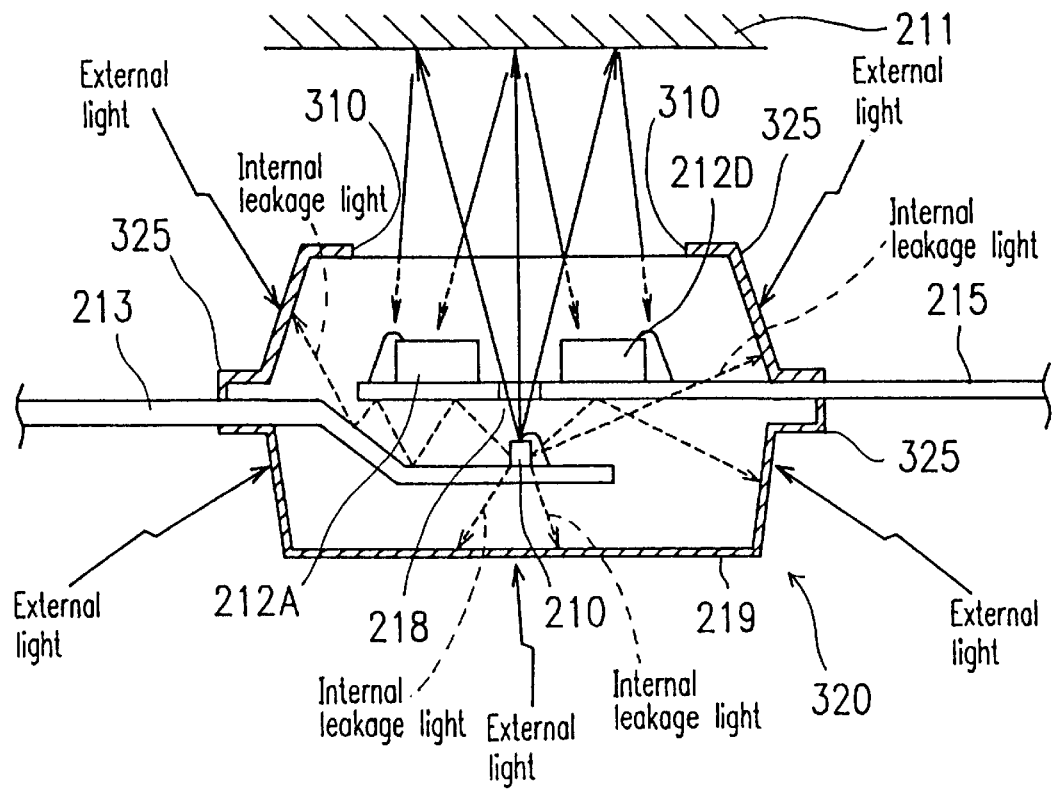
FIG. 21 is a cross sectional view of a photoreflective detector in a third example according to the present invention.
Figure 22:
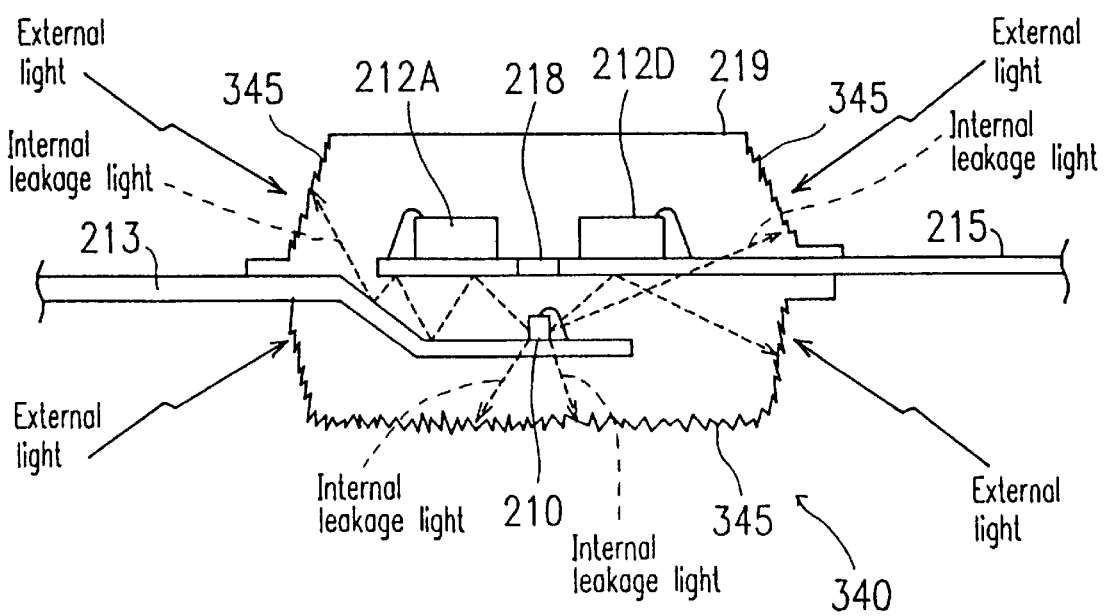
FIG. 22 is a cross sectional view of a photoreflective detector in a modification of the third example according to the present invention.
Figure 23:
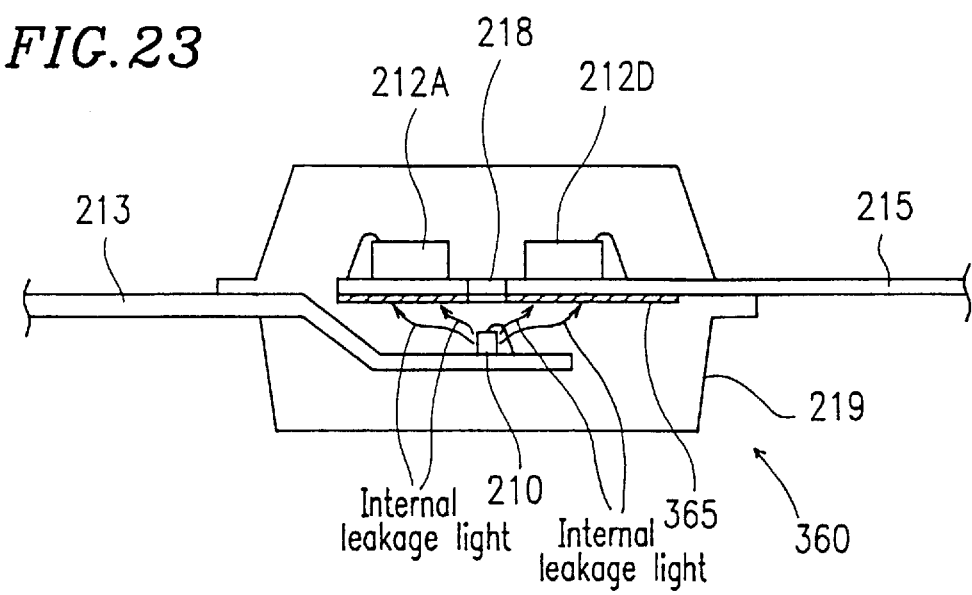
FIG. 23 is a cross sectional view of a photoreflective detector in another modification of the third example according to the present invention.

Such improvement is realized in, for example, photoreflective detectors 320, 340, and 360. FIGS. 21, 22 and 23 are respectively cross sectional views of the photoreflective detectors 320, 340 and 360. Identical elements as those in the photoreflective detector 200 will bear identical reference numerals therewith and the descriptions thereof will be omitted.

The photoreflective detector 320 shown in FIG. 21 includes an optical film structure 325, as a light shielding and absorbing structure, on an outer surface of the package 219 formed of a molding resin. The color and/or thickness of the optical film structure 325 is adjusted so as to absorb the wavelength range of the light emitted by the light emitting element 210 and also so as to shield the wavelength range of the light which can be received by the light receiving elements 212A through 212D. Thus, the optical film structure 325 prevents undesirable incidence of external light on the photoreflective detector 320 and also reduces the internal leakage light. The optical film structure 325 can be provided at any area of the outer surface of the package 219 except for areas 310 which are on the path of the light used for detection of the object 211.

The optical film structure 325 is formed by, for example, repeatedly molding the outer surface of the package 219, which has already been formed by a molding resin, using a thermoplastic or thermosetting resin. The repeated molding can be performed by potting, injection molding or transfer molding. Among these methods of molding, injection molding or transfer molding is preferable since it is necessary to press areas 310 by a mold in order to avoid formation of the optical film structure 325 on areas 310 and it is also preferable to facilitate formation of a hook structure used for forming a lens and the like after the formation of the optical film structure 325.

Alternatively, the optical film structure 325 is formed by non-molding methods such as coating, printing, plating, and vapor deposition after areas 310 is appropriately masked. In practice, a black film is formed by coating or metal plating.

The photoreflective detector 340 shown in FIG. 22 includes an irregular structure 345 having a plurality of irregularities on the outer surface of the package 219, as the light shielding and absorbing structure, for scattering external light or internal leakage light. The irregular structure 345 may be provided at any area of the outer surface of the package 219 except for areas which are on the path of the light used for detection of the object 211.

The photoreflective detector 360 shown in FIG. 23 includes a reflection-preventive element 365 on a bottom surface of the lead frame 215 provided for carrying the light receiving elements 212A through 212D. The bottom surface of the lead frame 215, which is opposite to the surface on which the light receiving elements 212A through 212D are mounted, oppose the light emitting element 210 to receive the light from the light emitting element 210. The reflection-preventive element 365 is processed to absorb the wavelength range of the light emitted by the light emitting element 210. The reflection-preventive element 365 is, for example, a reflection-preventive film. By provision of the reflection-preventive element 365, direct reflection of the light from the light emitting element 210 on the bottom surface of the lead frame 215 is reduced, thereby significantly reducing internal leakage light. The reflection-preventive element 365 may be provided on the entire surfaces of the lead frames 213 and 215.

The reflection-preventive element 365 is formed by, for example, coating, printing, plating or vapor deposition. In practice, a black film is formed by coating, or chrome or copper sulfide plating.

Example 4

Figure 24:
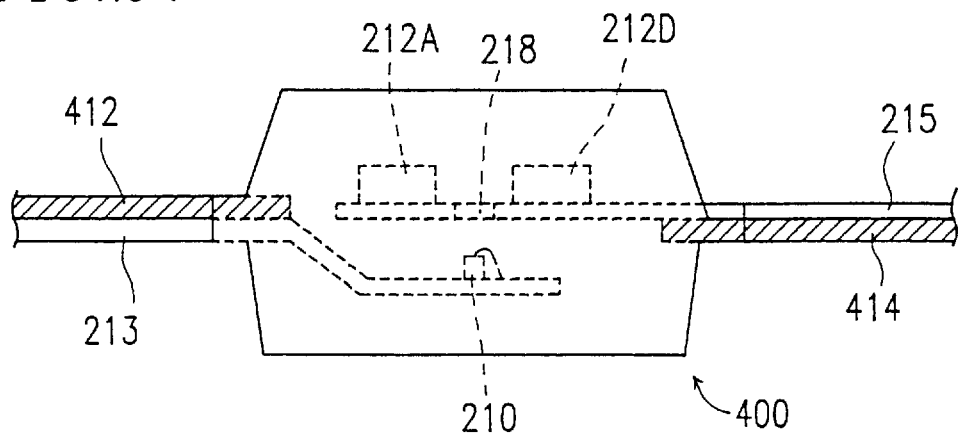
FIG. 24 is a side view of a photoreflective detector in a fourth example according to the present invention.
Figure 25:
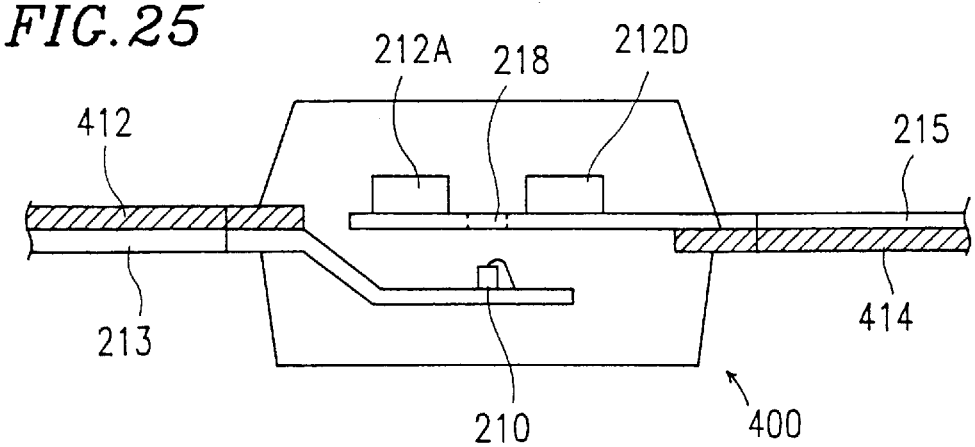
FIG. 25 is a cross sectional view of the photoreflective detector shown in FIG. 24.

FIGS. 24 and 25 are respectively a side view and a cross sectional view of a photoreflective detector 400 in a fourth example according to the present invention. Identical elements as those in the previous examples will bear identical reference numerals therewith and the descriptions thereof will be omitted.

The photoreflective detector 400 includes dummy frames 412 and 414. The dummy frame 412 is provided on a top surface of a part of the lead frame 213 (carrying the light emitting element 210) projecting outside the package 219. The dummy frame 414 is provided on a bottom surface of a part of the lead frame 215 (carrying the light receiving elements 212A through 212D) projecting outside the package 219. Due to such a structure, a two-layer structure is realized without bending the lead frames 213 and 215.

Figure 26:
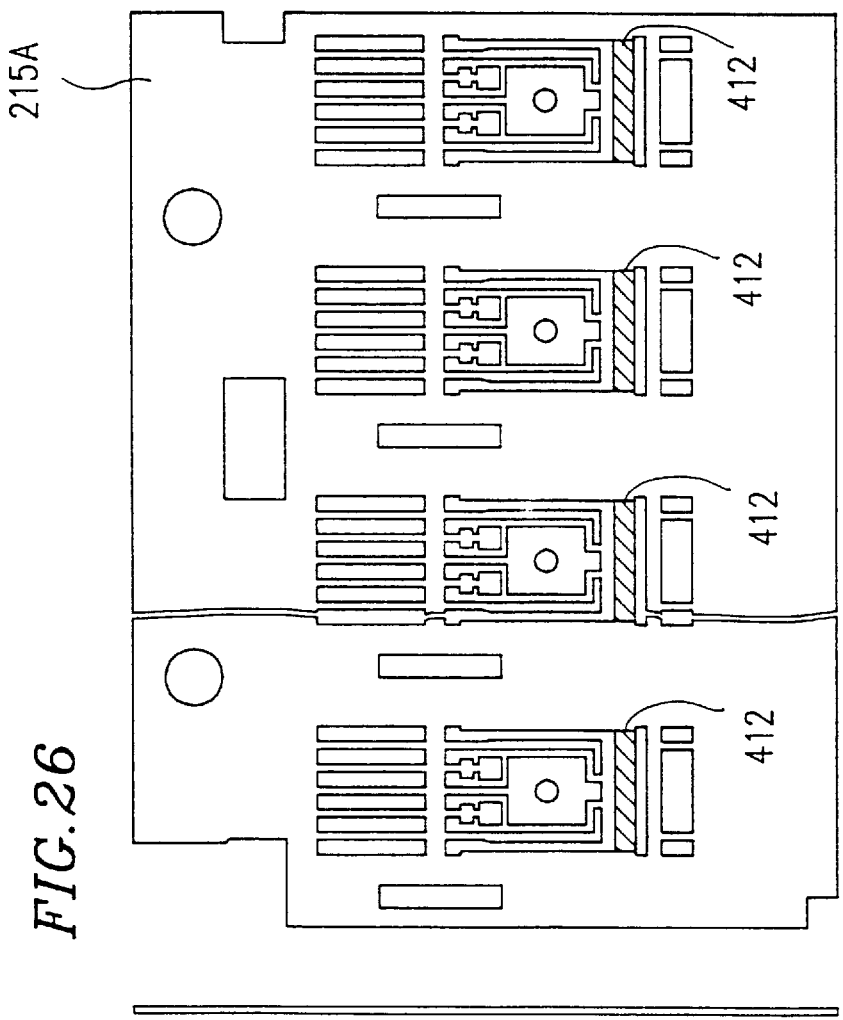
FIG. 26 is a plan view of a lead frame sheet used for the photoreflective detector shown in FIG. 24.
Figure 27:
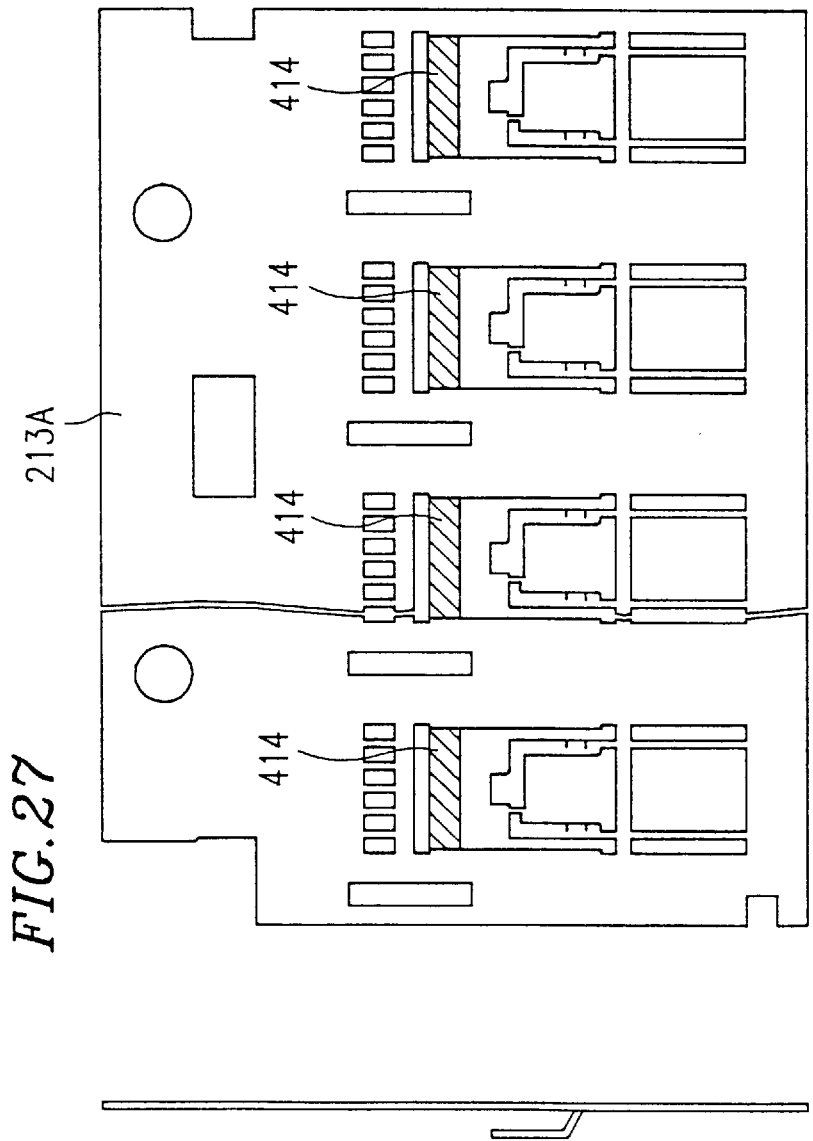
FIG. 27 is a plan view of another lead frame sheet used for the photoreflective detector shown in FIG. 24.

FIGS. 26 and 27 are respectively plan views of the lead frame sheets 213A and 215A, showing the positions where the dummy frames 412 and 414 are provided.

Example 5

Figure 28:
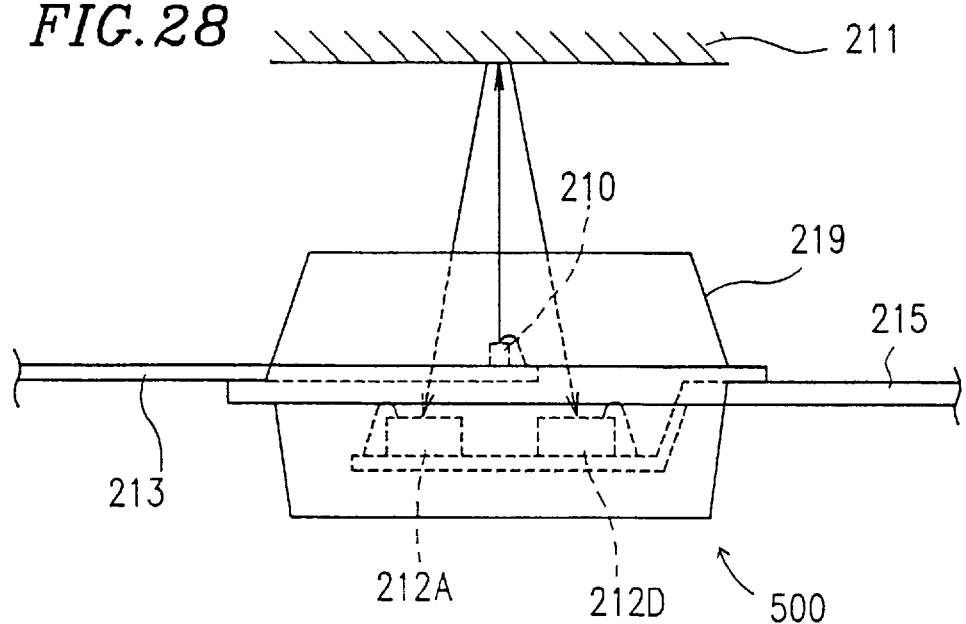
FIG. 28 is a side view of a photoreflective detector in a fifth example according to the present invention.
Figure 29:
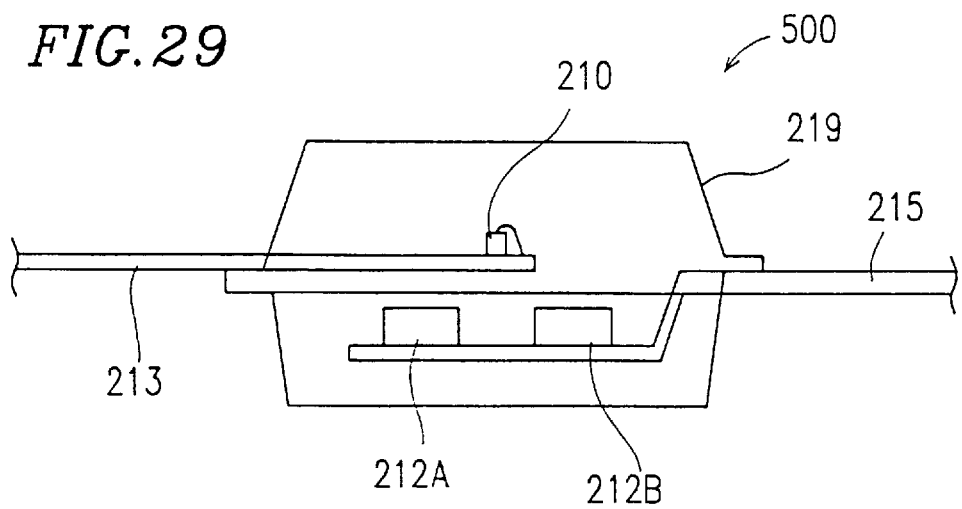
FIG. 29 is a cross sectional view of the photoreflective detector shown in FIG. 28.
Figure 30:
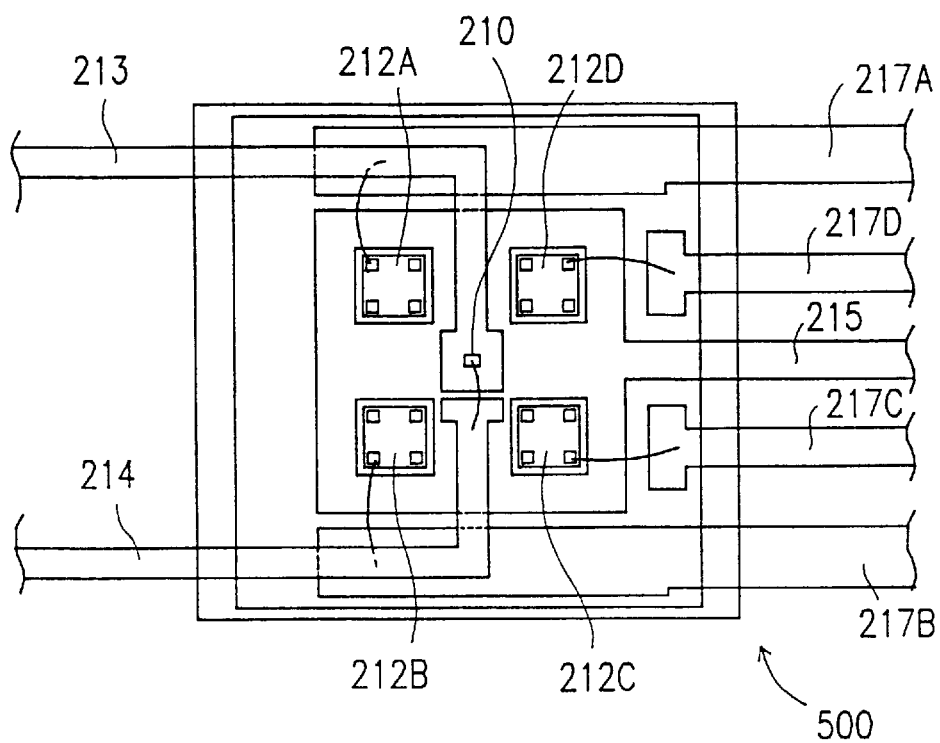
FIG. 30 is a plan view of the photoreflective detector shown in FIG. 28.

With reference to FIGS. 28 through 30, a photoreflective detector 500 in a fifth example according to the present invention will be described. Identical elements as those in the previous examples will bear identical reference numerals therewith and the descriptions thereof will be omitted.

FIGS. 28, 29 and 30 are respectively a side view, a cross sectional view, and a top view of the photoreflective detector 500.

In the photoreflective detector 500, the lead frame 215 (carrying the light receiving elements 212A through 212D) is formed so as to be located below the lead frame 213 (carrying the light emitting element 210). Thus, the light emitting element 210 is above the light receiving elements 212A through 212D. Due to such a structure, it is not necessary to form a hole in the lead frame 215 for allowing transmission of the light from the light emitting element 210 as is necessary when the light emitting element 210 is below the light receiving elements 212A through 212D. In order to allow the light reflected by the object 211 to be incident on the light receiving elements 212A through 212D without being obstructed by the lead frame 213, the lead frame 213 needs to be, for example, L-shaped as shown in FIG. 30.

Example 6

Figure 31:
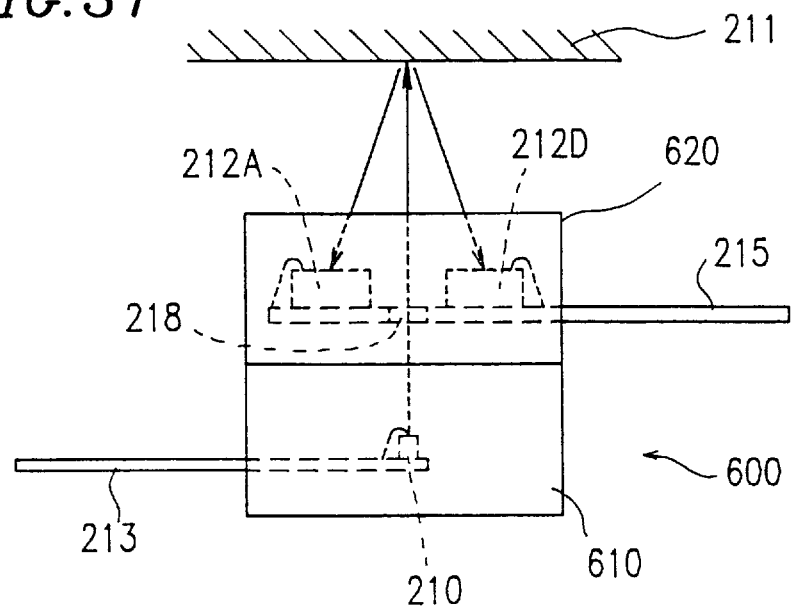
FIG. 31 is a side view of a photoreflective detector in a sixth example according to the present invention.

With reference to FIG. 31, a photoreflective detector 600 in a sixth example according to the present invention will be described. FIG. 31 is a side view of the photoreflective detector 600. Identical elements as those in the previous examples will bear identical reference numerals therewith and the descriptions thereof will be omitted.

The photoreflective detector 600 includes a light emitting section 610 having the light emitting element 210 molded therein and a light receiving section 620 having the light receiving elements 212A through 212D molded therein and provided on the light emitting section 610. The light emitting section 610 and the light receiving section 620 are formed by separate steps of resin molding. The light emitting section 610 and the light receiving section 620 are bonded to each other with an adhesive such as an epoxy resin. Since the light receiving element 212A through 212D are located above the light emitting element 210, the lead frame 215 has a hole 218 for allowing transmission of the light from the light emitting element 210.

Example 7

Figure 32:
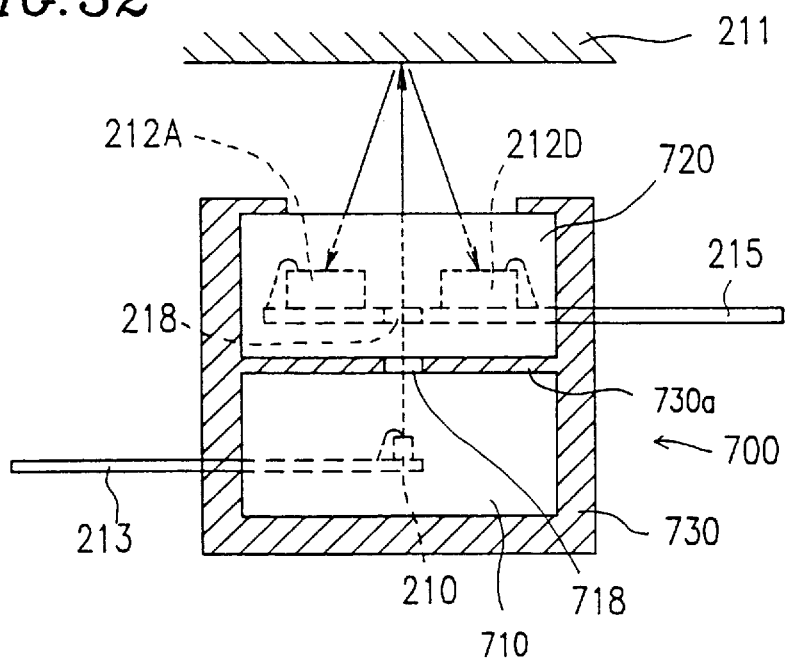
FIG. 32 is a side view of a photoreflective detector in a seventh example according to the present invention.

With reference to FIG. 32, a photoreflective detector 700 in a seventh example according to the present invention will be described. FIG. 32 is a side view of the photoreflective detector 700. Identical elements as those in the previous examples will bear identical reference numerals therewith and the descriptions thereof will be omitted.

The photoreflective detector 700 includes a light-shielding holder 730 (container) which accommodates a light emitting section 710 and a light receiving section 720 provided on the light emitting section 710. The light emitting section 710 has the light emitting element 210 accommodated therein, and the light receiving section 720 has the light receiving elements 212A through 212D accommodated therein. The light emitting section 710 and the light receiving section 720 are separated by a partition 730a. Since the light receiving element 212A through 212D are located above the light emitting element 210, the partition 730a has a hole 718 and the lead frame 215 has a hole 218 for allowing transmission of the light from the light emitting element 210.

Since the holder 730 is formed of a light-shielding resin, incidence of external light and internal leakage light on the light receiving elements 212A through 212D can be prevented.

The holder 730 is provided on the entire outer surface of the light emitting section 710 and the light receiving section 720 except for the area used for performing the tilt detection in this example, but can alternatively be provided on a partial area of the outer surface.

Example 8

Figure 33A:
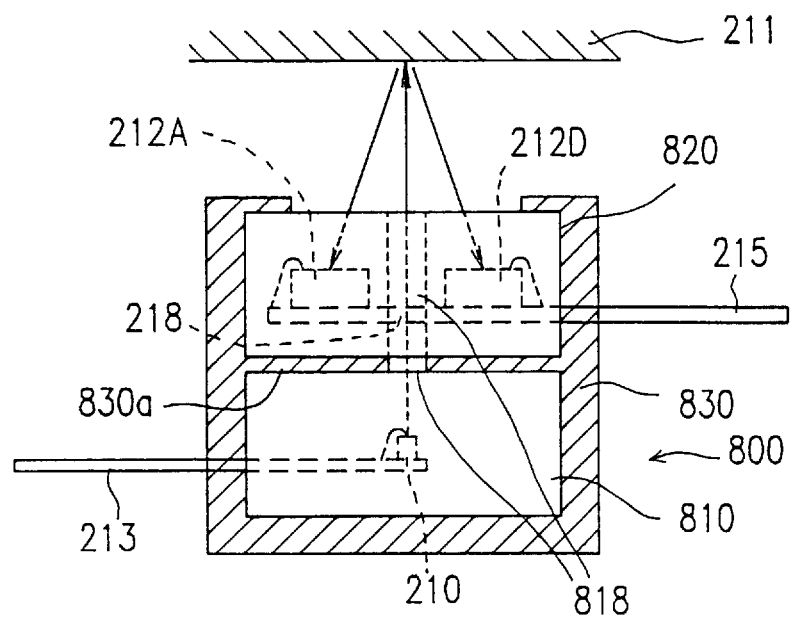
FIG. 33A is a side view of a photoreflective detector in an eighth example according to the present invention.
Figure 33B:
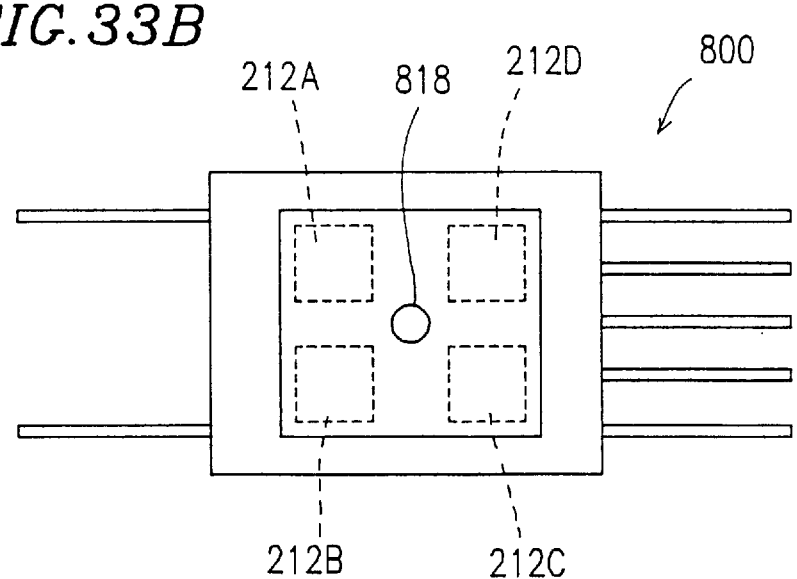
FIG. 33B is a plan view of the photoreflective detector shown in FIG. 33A.

With reference to FIGS. 33A and 33B, a photoreflective detector 800 in an eighth example according to the present invention will be described. FIGS. 33A and 33B are respectively a side view and a plan view of the photoreflective detector 800. Identical elements as those in the previous examples will bear identical reference numerals therewith and the descriptions thereof will be omitted.

The photoreflective detector 800 includes a package 830 (container) formed of a resin which accommodates a light emitting section 810 and a light receiving section 820 provided on the light emitting section 810. The light emitting section 810 has the light emitting element 210 molded therein, and the light receiving section 820 has the light receiving elements 212A through 212D molded therein. The light emitting section 810 and the light receiving section 820 are integrally molded with the package 830 so as to be separated by a partition 830a. In order to allow transmission of the light from the light emitting element 210, the lead frame 215 has a hole 218, and the partition 830a and the light receiving section 820 has a through hole 818 extending from the bottom of the partition 830a to the top face of the light receiving section 820. The hole 818 is formed by the same step as the package 830.

The package 830 is provided on the entire outer surface of the light emitting section 810 and the light receiving section 820 except for the area used for performing the tilt detection in this example, but can alternatively be provided on a partial area of the outer surface.

Example 9

Figure 34A:
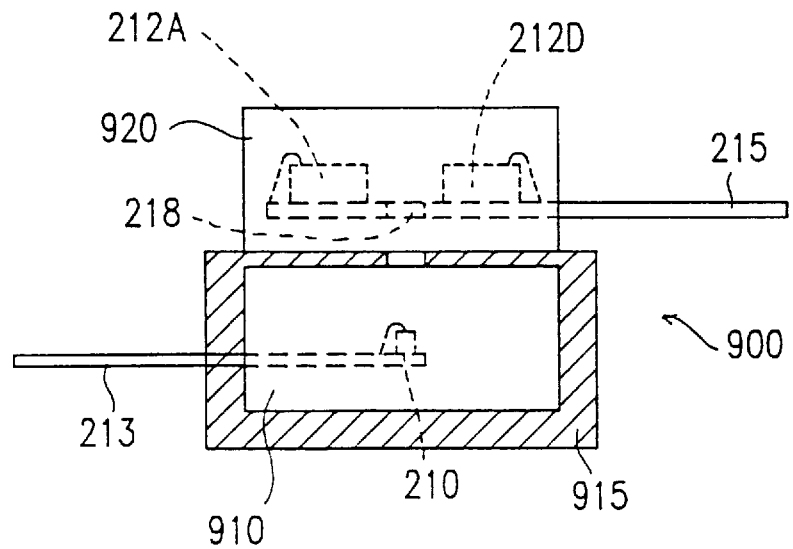
FIG. 34A is a side view of a photoreflective detector in a ninth example according to the present invention.
Figure 34B:
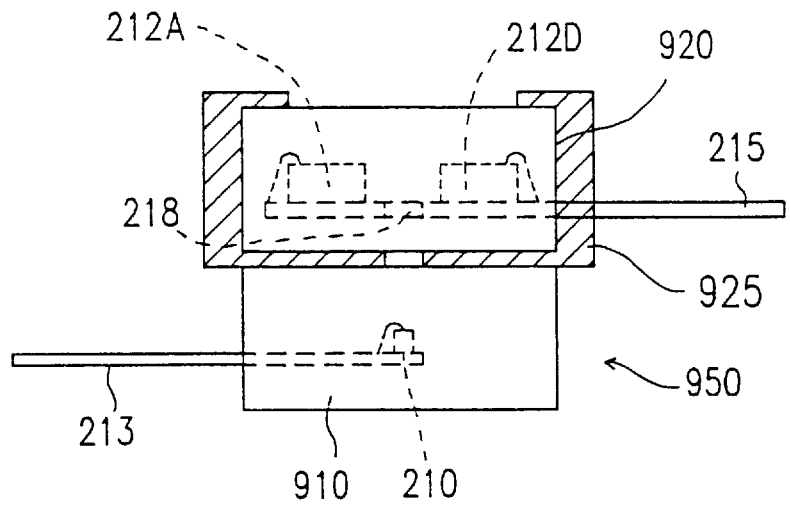
FIG. 34B is a side view of a photoreflective detector in a modification of the ninth example according to the present invention.

With reference to FIGS. 34A, a photoreflective detector 900 in a ninth example according to the present invention will be described. FIG. 34A is a side view of the photoreflective detector 900. In FIGS. 34A and 34B, identical elements as those in the previous examples will bear identical reference numerals therewith and the descriptions thereof will be omitted.

The photoreflective detector 900 includes a package 915 formed of a light-shielding resin. The package 915 defines a light emitting section 910 having the light emitting element 210 molded therein. The package 915 and the light emitting section 910 are integrally formed. A light receiving section 920 having the light receiving elements 212A through 212D molded therein and provided on the light emitting section 910 is bonded to the package 915.

The light emitting section 910 may simply be accommodated in the package 915.

The package 915 is provided on the entire outer surface of the light emitting section 910 in this example, but can alternatively be provided on a partial area of the outer surface.

FIG. 34B is a side view of a photoreflective detector 950 as a modification of the ninth example.

The photoreflective detector 950 includes a package 925 formed of a light-shielding resin. The package 925 defines a light receiving section 920 having the light receiving elements 212A through 212D molded therein. The package 925 and the light receiving section 920 are integrally formed. A light emitting section 910 having the light emitting element 210 molded therein and provided below the light receiving section 920 is bonded to the package 925.

The light receiving section 920 may simply be accommodated in the package 925.

The package 925 is provided on the entire outer surface of the light receiving section 920 except for the area used for tilt detection in this example, but can alternatively be provided on a partial area of the outer surface.

Example 10

With reference to FIGS. 35A through 35E, a photoreflective detector 1000 in a tenth example according to the present invention will be described. Identical elements as those in the previous examples will bear identical reference numerals therewith and the descriptions thereof will be omitted.

Figure 35A:
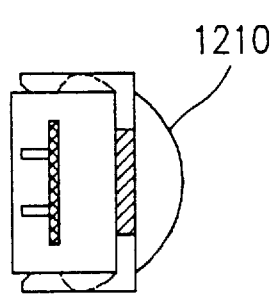
FIGS. 35A, 35C and 35D are side views of a photoreflective detector in a tenth example according to the present invention.
Figure 35B:
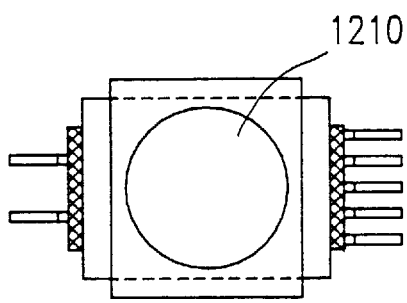
FIG. 35B is a top view of the photoreflective detector shown in FIGS. 35A, 35C and 35D.
Figure 35C:
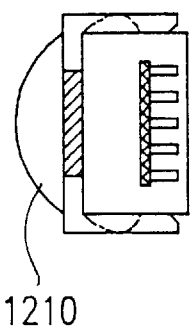
Figure 35D:
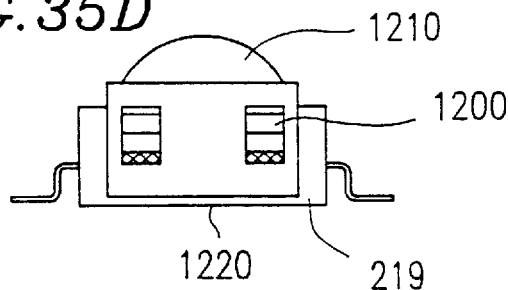
Figure 35E:
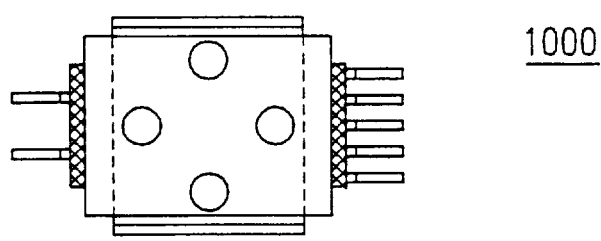
FIG. 35E is a bottom view of the photoreflective detector shown in FIGS. 35A, 35C and 35D.

FIGS. 35A, 35C and 35E are side views, FIG. 35B is a top view, and FIG. 35E is a bottom view of the photoreflective detector 1000.

The photoreflective detector 1000 includes hooks 1200 used for molding an optical lens 1210 of a resin on a top surface of the package 219. The hooks 1200 are formed in the same step as the light shielding and absorbing structure (H) which is provided for preventing incidence of external light and internal leakage light on the light receiving elements. The optical lens 1210 can be formed appropriately in accordance with the usage of the photoreflective detector 1000. The photoreflective detector 1000 can be used as, for example, a sensor for two-dimensionally detecting the existence of an object or tilt direction and angle of the object.

Since the light receiving elements 212A through 212D can be located around the light emitting element 210, the entire size of the photoreflective detector 1000 can be reduced and the S/N ratio can be improved. In practice, the photoreflective detector 1000 can be used in, for example, a data input device for a computer (pointing device), an input pad for a game machine, and a joystick.

Hereinafter, a method for detecting a tilt angle and direction using the photoreflective detector 1000 will be described.

Figure 36A:
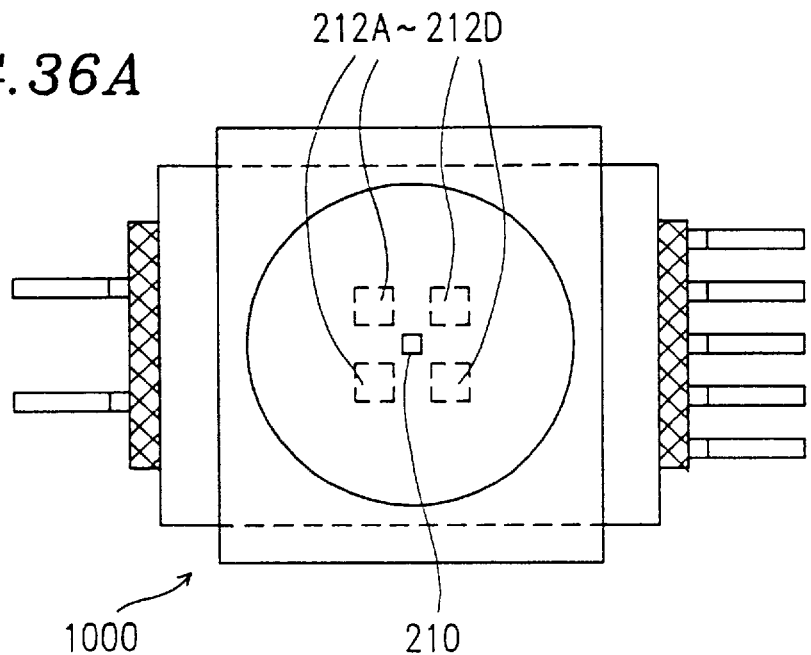
FIG. 36A is an enlarged top view of the photoreflective detector shown in FIGS. 35A through 35E.
Figure 36B:
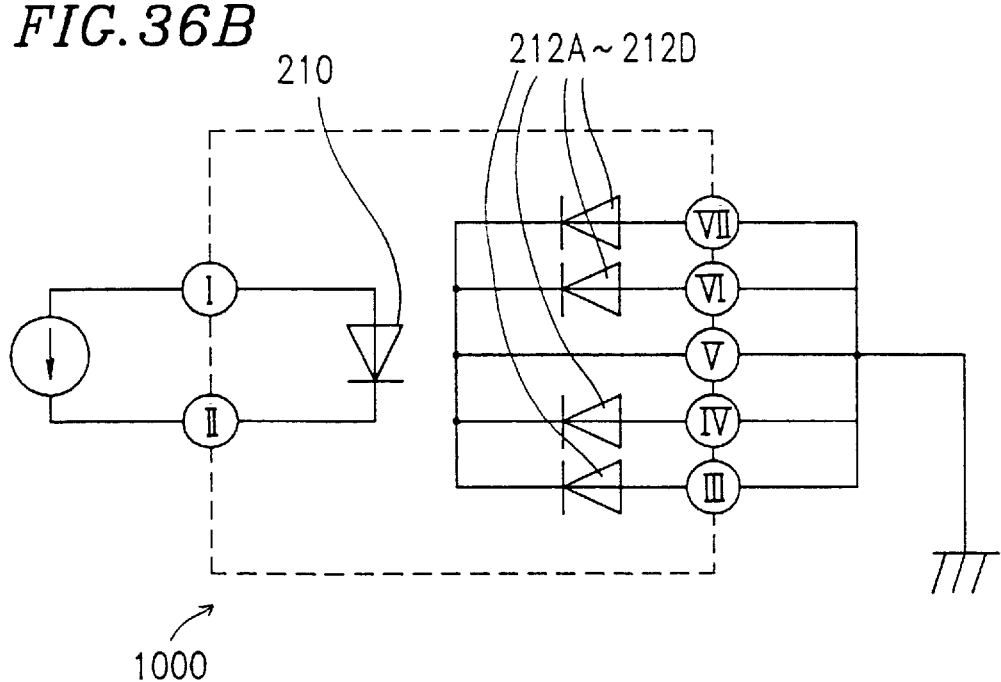
FIG. 36B is an internal connection diagram of the photoreflective detector shown in FIGS. 35A through 35E.

FIG. 36A is a plan view of the photoreflective detector 1000, and FIG. 36B is an internal connection diagram of the photoreflective detector 1000.

As shown in FIG. 36B, the light emitting element (light emitting diode) 210 is connected to lead frames I and II. The light receiving elements (photodiodes) 212A through 212D are connected to lead frames III through VII. A constant-current power supply is connected between the lead frames I and II. The lead frames III through VII are grounded.

Figure 37A:
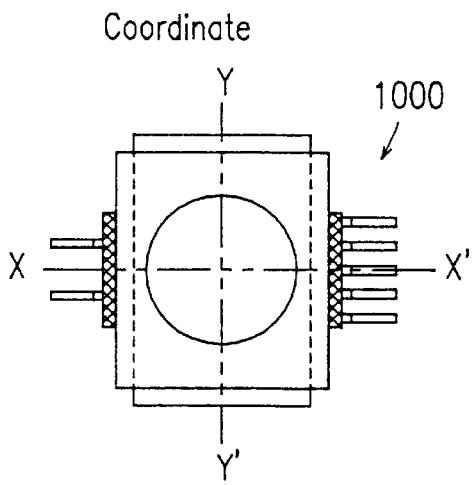
FIGS. 37A through 37C are schematic views illustrating X- and Y-axis rotation directions of the photoreflective detector shown in FIGS. 35A through 35E.
Figure 37B:
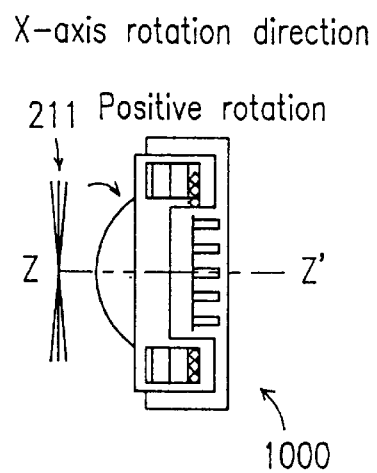
Figure 37C:
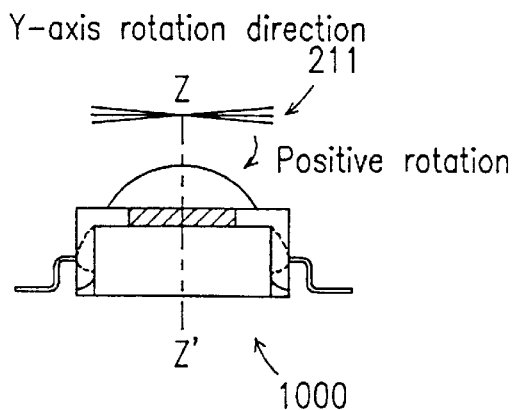

X axis and Y axis are set with respect to the photoreflective detector 1000 as shown in FIG. 37A. X-axis rotation direction is set as shown in FIG. 37B, and Y-axis rotation direction is set as shown in FIG. 37C. A plane parallel to the bottom surface 1220 (FIG. 35D) of the photoreflective detector 1000 is defined as a reference plane used for representing tilt angle ψ of the object 211 in X- and Y-axis rotation directions. When the object 211 is on the reference plane, the rotation angle ψ is 0.

Figure 38A:
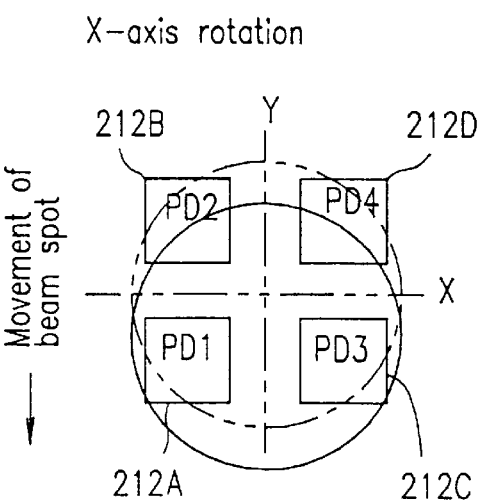
FIGS. 38A and 38B are top views showing optical images obtained by the photoreflective detector shown in FIGS. 35A through 35E.
Figure 38B:
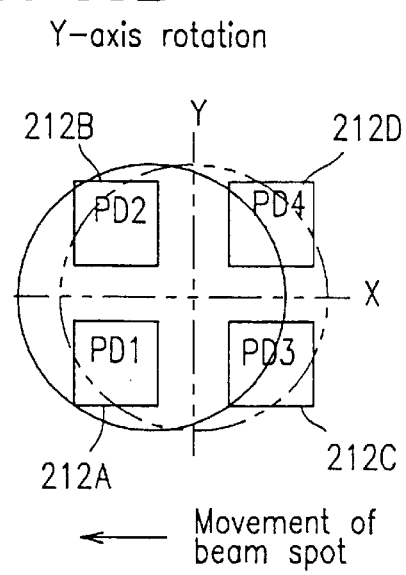

When the object 211 is not tilted, namely, is on the reference plane, the light reflected by the object 211 is incident on the four light receiving elements 212A through 212D uniformly as represented by a chain line in FIGS. 38A and 38B. In contrast, when the object 211 is tilted or rotated around the X axis, the optical image formed by the reflected light is positioned as represented by solid line in FIG. 38A. When the object 211 is tilted or rotated around the Y axis, the optical image formed by the reflected light is positioned as represented by a solid line in FIG. 38B.

In accordance with such movement of the optical image formed by the reflected light, the output levels $S_A$ through $S_D$ from the light receiving elements 212A through 212D change. The following operation is performed utilizing such change to find the tilt angle and direction of the object 211.

First, subtracted output $A_X$ regarding X-axis rotation direction and subtracted output $A_Y$ regarding Y-axis rotation direction are obtained by expressions (7) and (8), respectively.

$$A_X=(S_A+S_C)-(S_B+S_D) \quad (7)$$

$$A_Y=(S_A+S_C)-(S_B+S_D) \quad (8)$$

Figure 39A:
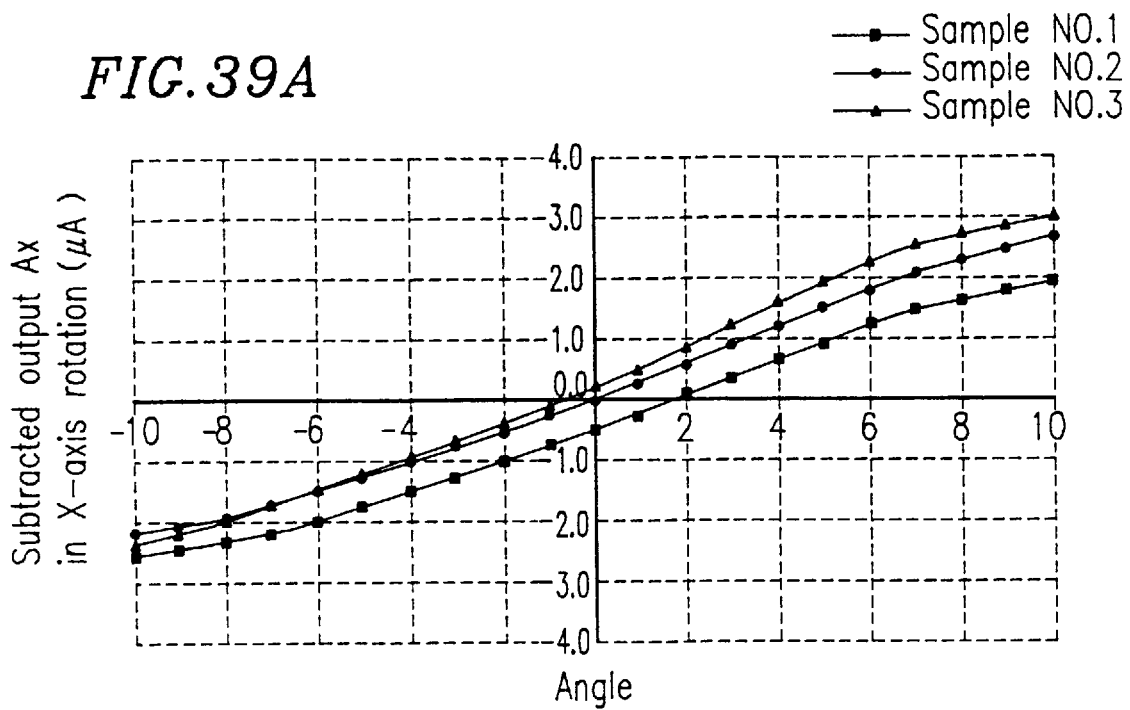
FIGS. 39A and 39B are graphs showing the subtracted output $A_x$ vs. tilt angle relationship regarding X- and Y-axis rotation directions in the photoreflective detector shown in FIGS. 35A through 35E.
Figure 39B:
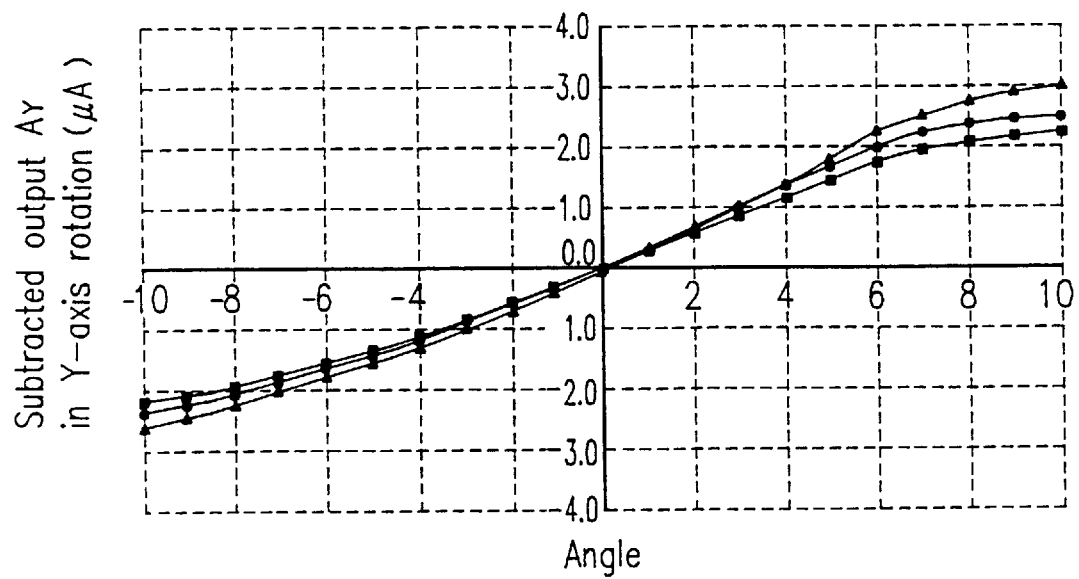

FIG. 39A shows an example of the subtracted output $A_X$ vs. tilt angle relationship regarding X-axis rotation direction. FIG. 39B shows an example of the subtracted output $A_Y$ vs. tilt angle relationship regarding Y-axis rotation direction.

The light emitting element 210 in the photoreflective detector 1000 is usually formed of a compound semiconductor and thus exhibits change in accordance with time passage and temperature. In order to reduce the influence of the time passage and temperature, the following operation is performed.

Added output $B_X$ regarding X-axis rotation direction and added output $B_Y$ regarding Y-axis rotation direction are obtained by expressions (9) and (10), respectively.

$$B_X=S_A+S_B+S_C+S_D \quad (9)$$

$$B_Y=S_A+S_B+S_C+S_D \quad (10)$$

Figure 40A:
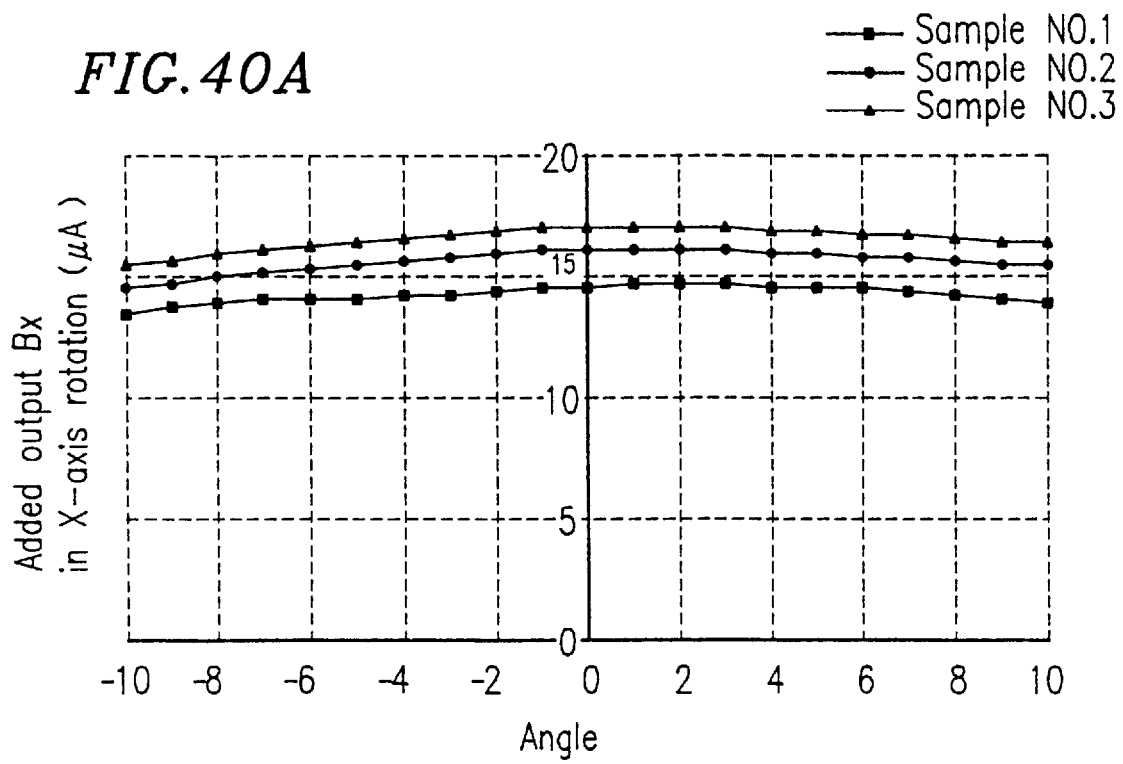
FIGS. 40A and 40B are graphs showing the added output B, vs. tilt angle relationship regarding X- and Y-axis rotation directions in the photoreflective detector shown in FIGS. 35A through 35E.
Figure 40B:
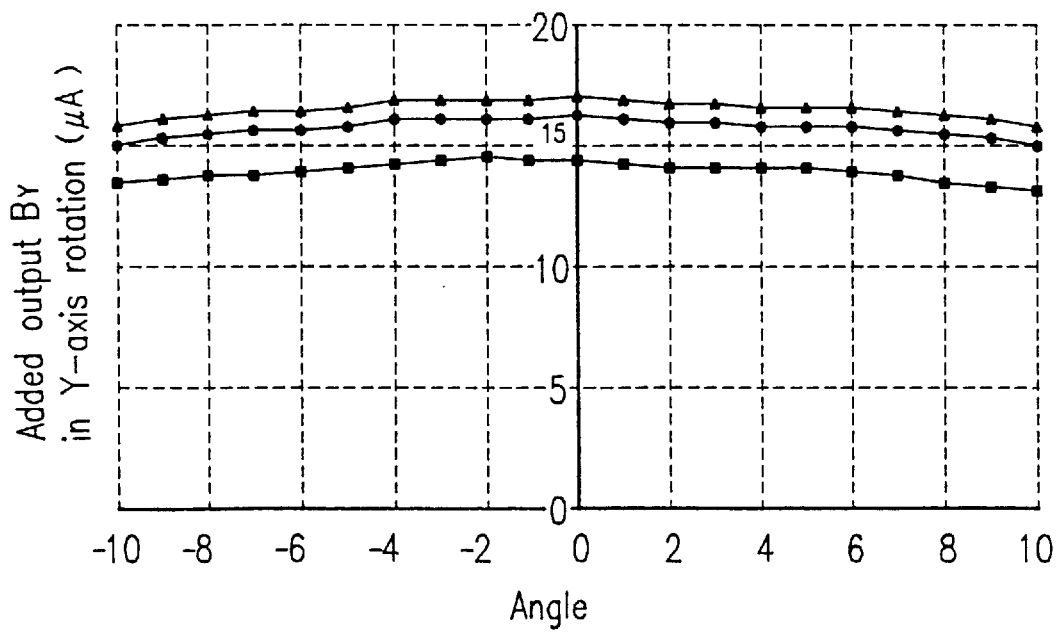

FIG. 40A shows an example of the added output $B_X$ vs. tilt angle relationship regarding X-axis rotation direction. FIG. 40B shows an example of the added output $B_Y$ vs. tilt angle relationship regarding Y-axis rotation direction.

Figure 41A:
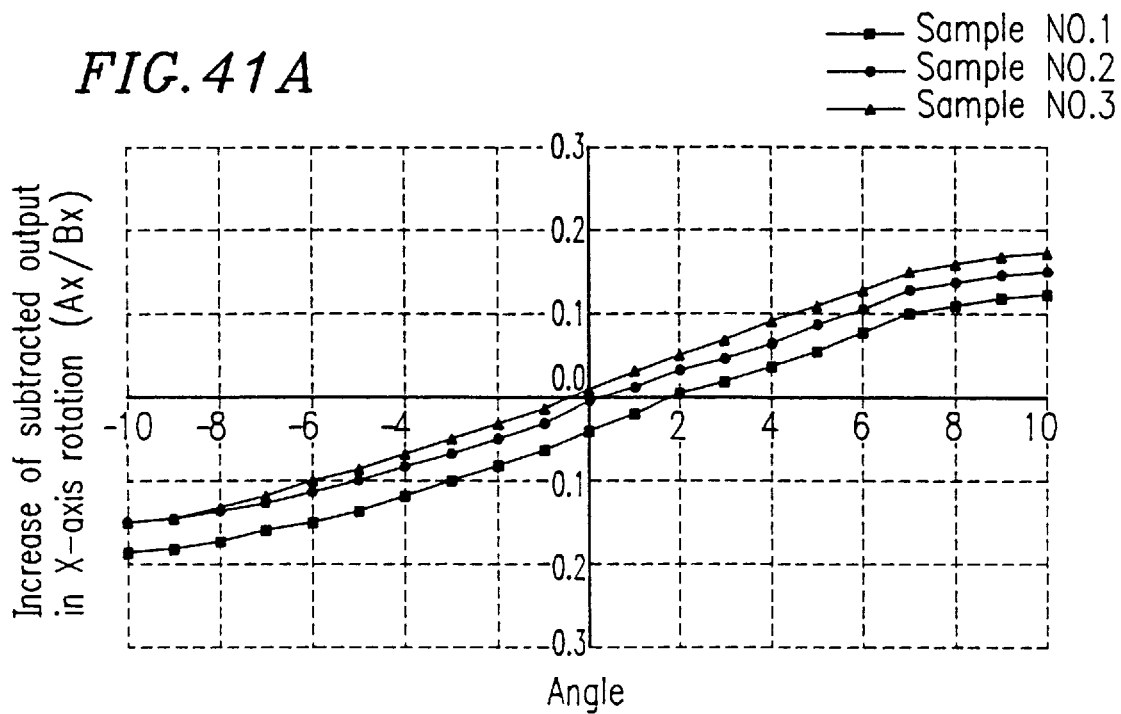
FIGS. 41A and 41B are graphs showing the increase of subtracted output $A_x/B_x$ vs. tilt angle relationship regarding X- and Y-axis rotation directions in the photoreflective detector shown in FIGS. 35A through 35E.
Figure 41B:
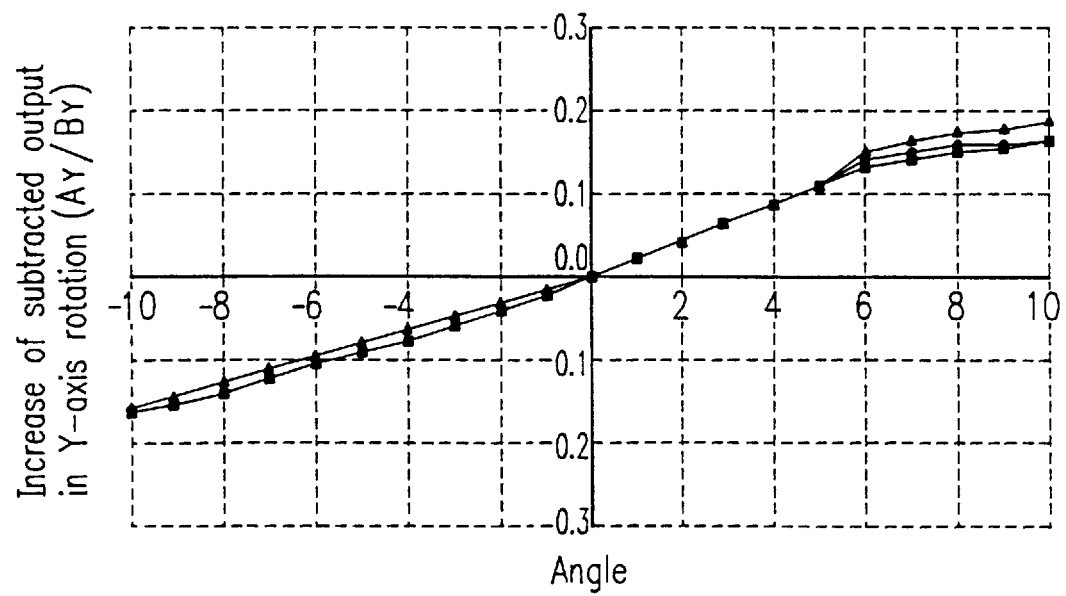

Next, increase of subtracted output $A_X/B_X$ regarding X-axis rotation direction and increase of subtracted output $A_Y/B_Y$ regarding Y-axis rotation direction are obtained. FIG. 41A shows an example of the increase of subtracted output $A_X/B_X$ vs. tilt angle relationship regarding X-axis rotation direction. FIG. 41B shows an example of the increase of subtracted output $A_Y/B_Y$ vs. tilt angle relationship regarding Y-axis rotation direction.

Figure 42A:
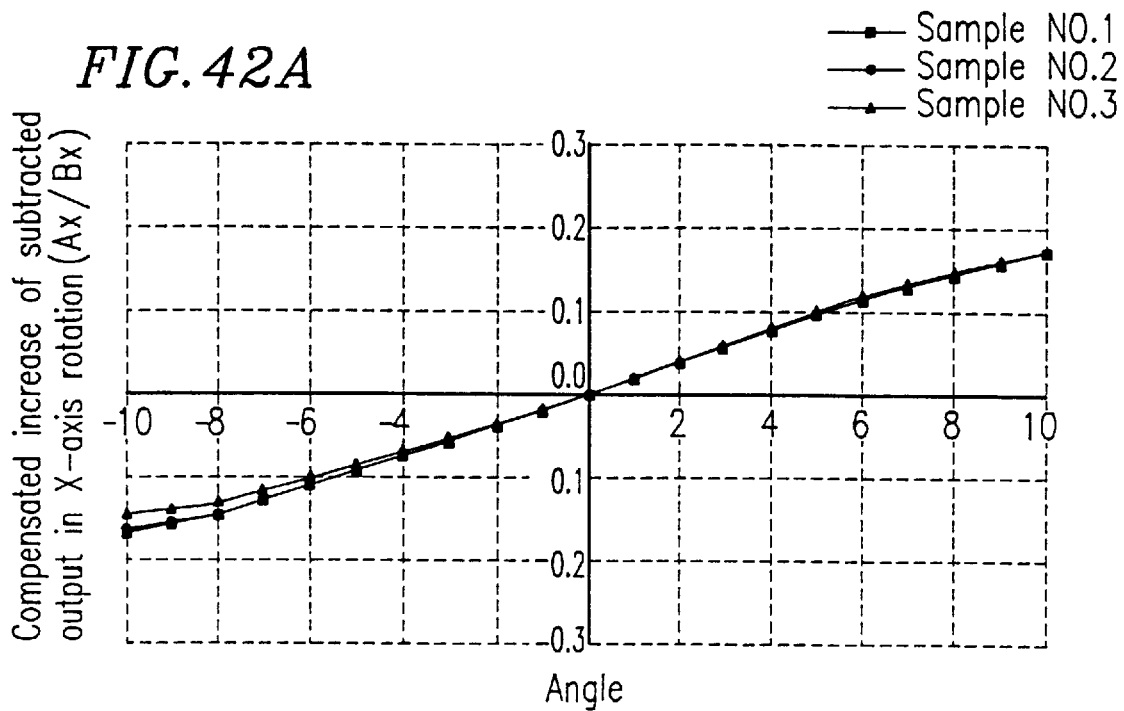
FIGS. 42A and 42B are graphs showing the compensated increase of subtracted output $A_x/B_x$ vs. tilt angle relationship regarding X- and Y-axis rotation directions in the photoreflective detector shown in FIGS. 35A through 35E.
Figure 42B:
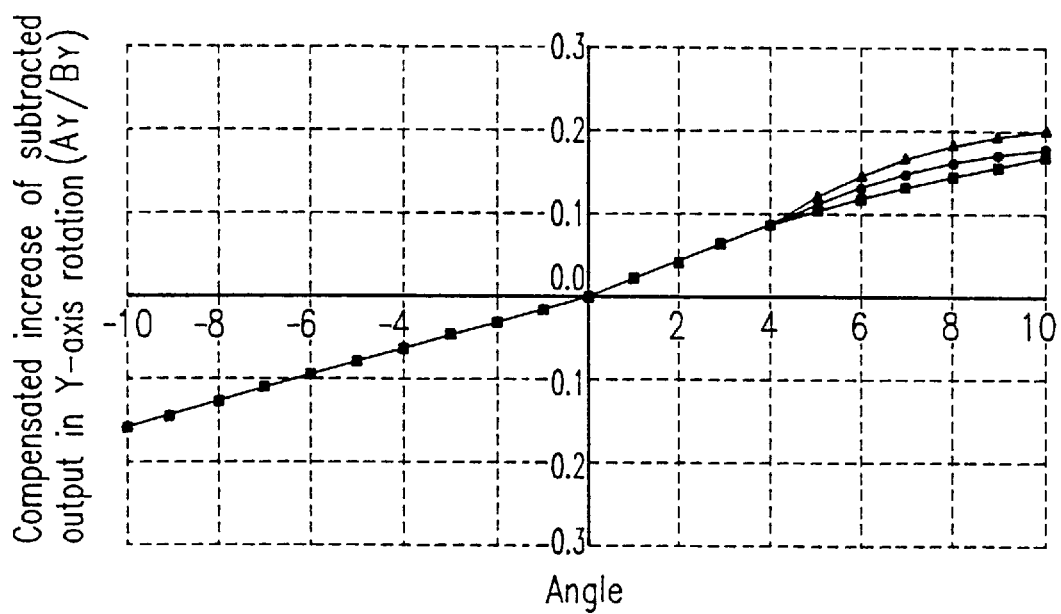

Then, offset caused during assembly by positional dispersion of the elements of the photoreflective detector 1000 is compensated. The compensation is performed by, for example, storing the initial dispersion in a microcomputer and subtracting the stored value from the newly calculated value from the latest detected signals. FIG. 42A shows an example of the compensated increase of subtracted output $A_X/B_X$ vs. tilt angle relationship regarding X-axis rotation direction. FIG. 42B shows an example of the compensated increase of subtracted output $A_Y/B_Y$ vs. tilt angle relationship regarding Y-axis rotation direction.

FIGS. 39A through 42B each show three curves to exhibit results of three different samples. In FIGS. 39A and 39B, the results are slightly different among the three samples. In contrast, in FIGS. 42A and 42B showing the results after the compensation, substantially no difference is exhibited among the samples. Based on the relationship shown in FIGS. 42A and 42B, the tilt angles in the X direction and the Y direction are found.

Figure 43:
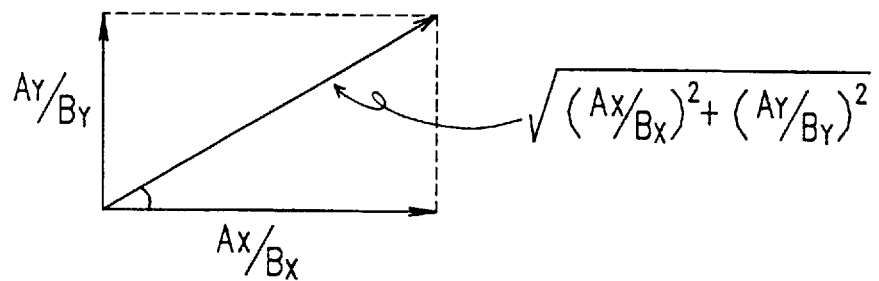
FIG. 43 is a view showing vector calculation for detecting a tilt direction in the photoreflective detector shown in FIGS. 35A through 35E.

By obtaining the vector of compensated increases of subtracted output $A_X/B_X$ and $A_Y/B_Y$, the tilt direction is found as angle θ shown in FIG. 43.

In this manner, the tilt angle and direction of the object 211 can be obtained two-dimensionally based on the output levels $S_A$ through $S_D$ from the light receiving elements 212A through 212D.

In this example, the lens 1210 is separate from the photoreflective detector 1000. The lens 1210 can be integrally molded with the photoreflective detector 1000 by forming the top surface of the package 219 to be convex lens-like. In such a case, the same function and effect can be achieved with a simpler production method and less cost.

As has been described so far, in a photoreflective detector having a light emitting element and a light receiving element arranged on the same horizontal plane, light emitted from side surfaces of the light emitting element is directly incident on the light receiving element. In contrast, according to the present invention, the light emitting element and the light receiving element are positioned so as to have different distances from the object. Due to such a structure, the light from side surfaces of the light emitting element is prevented from being directly incident on the light receiving element.

In the case where the photoreflective detector has a two-story structure in which a lead frame carrying the light emitting element is below a lead frame carrying the light receiving element, the light from the light emitting element is shielded by the lead frame carrying the light receiving element. In order to guarantee that the light from the light emitting element is incident on the object, a hole can be formed in the lead frame carrying the light receiving element, or the light emitting element can be located so as to allow the light from the light emitting element to pass by the lead frame carrying the light receiving element. In these structures, light which is not necessary for detection can be shielded, thus allowing only the light necessary for detection to be incident on the object.

Such a two-story structure can also be formed in a resin-molded package. A light emitting element and a plurality of the light receiving elements can be molded in the same chamber defined by clamping in the state where the light emitting element is surrounded by the light receiving elements when seen from above. In such a structure, the size of the photoreflective detector can be reduced.

Such a structure can also be realized by separately molding and stacking the light emitting element and the light receiving elements.

By providing a light shielding and absorbing structure on an outer surface of the package formed of a molding resin, incidence of external light on the package is prevented, and internal leakage light is absorbed. Thus, the S/N ratio can be improved.

According to the present invention, the light emitting element and the light receiving element are located so as to have different distances from the object. Due to such a structure, even if light is emitted from side surfaces of the light emitting element, such light is not directly incident on the light receiving element. Thus, reception of the unnecessary light by the light receiving element is prevented, thereby improving the S/N ratio and precision for tilt detection.

By providing a lead frame carrying the light emitting element at a lower level than a lead frame carrying the light receiving element (two-story structure), the surface on which both elements are mounted is reduced, which contributes to size reduction in the photoreflective detector. Furthermore, the light from the light emitting element can be prevented from being directly incident on the light receiving element without providing a wall or other obstructing item, thus simplifying the structure.

By forming a hole in a lead frame carrying the light receiving element for allowing transmission of the light from the light emitting element, the light emitted in undesired directions is eliminated. Accordingly, the light is incident on the light receiving element with a higher efficiency, thus further enhancing detection precision.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A photoreflective detector, comprising:
   a light emitting element supported by a first lead frame; and
   a light receiving element supported by a second lead frame and located so as to receive light emitted from the light emitting element and reflected by an object,
   wherein the light emitting element and the light receiving element are located to have sufficiently different positions and distances from the object so as to avoid direct incidence of the light emitted by the light emitting element on the light receiving element.

2. A photoreflective detector according to claim 1, wherein the first lead frame carrying the light emitting element is located at a lower level than the second lead frame carrying the light receiving element.

3. A photoreflective detector according to claim 2, wherein the second lead frame has a hole for allowing transmission of the light emitted by the light emitting element to the object through the hole.

4. A photoreflective detector for performing optical detection of an object, comprising:
   a light emitting element mounted on a first lead frame;
   a light receiving element mounted on a second lead frame and located so as to receive light emitted by the light emitting element and reflected by the object, the light receiving element generating an optical output to be used for the optical detection; and
   a package entirely formed of a single molding resin, the package having the light emitting element and the light receiving element molded therein, wherein:
      the light emitting element and the light receiving element are located to have sufficiently different positions and distances from the object so as to avoid direct incidence of the light emitted by the light emitting element on the light receiving element,
      the first lead frame and the second lead frame are located at two different levels in the package and project outside the package, and
      the first lead frame or the second lead frame, outside the package, is on the same level as a surface of the second lead frame on which the light receiving element is mounted; and the other lead frame, outside the package, is parallel to the surface of the second lead frame with a gap which is substantially equal to a thickness of the lead frame.

5. A photoreflective detector according to claim 4, wherein a part of the first lead frame and a part of the second lead frame outside the package each have two layers, and one of the two layers of the first lead frame and one of the two layers of the second lead frame are dummy frames.

6. A photoreflective detector according to claim 4, wherein the first lead frame is located below the second lead frame, and the second lead frame has a hole for allowing transmission of light emitted by the light emitting element to the object through the hole.

7. A photoreflective detector according to claim 4, further comprising a light shielding and absorbing structure for shielding external light and absorbing internal leakage light on at least a part of an outer surface of the package excluding an area used for performing the optical detection.

8. A photoreflective detector according to claim 7, wherein the light shielding and absorbing structure is provided on the entire outer surface of the package excluding the area used for performing the optical detection.

9. A photoreflective detector according to claim 7, wherein the light shielding and absorbing structure is formed as a result of molding one of a thermoplastic resin and a thermosetting resin.

10. A photoreflective detector according to claim 7, wherein the light shielding and absorbing structure is formed as a result of a method selected from the group consisting of coating, printing, plating and vapor deposition.

11. A photoreflective detector according to claim 7, wherein the light shielding and absorbing structure is an irregular structure.

12. A photoreflective detector according to claim 4, further comprising a reflection-preventive element on a bottom surface of at least the second lead frame.

13. A photoreflective detector according to claim 12, wherein the reflection-preventive element is provided on the entire surfaces of the first lead frame and the second lead frame.

14. A photoreflective detector according to claim 12, wherein the reflection-preventive element is formed as a result of a method selected from the group consisting of coating, printing, plating and vapor deposition.

15. A photoreflective detector for performing optical detection of an object, comprising:
   a light emitting section formed of a resin and including a first lead frame carrying a light emitting element molded therein; and
   a light receiving section formed of a resin and including a second lead frame carrying a light receiving element molded therein,
      wherein the light emitting section and the light receiving section are stacked in such a manner that light emitted by the light emitting element is reflected by the object to be incident on the light receiving element to cause the light receiving element to generate an optical output used for optical detection, and
      the light emitting element and the light receiving element are located to have sufficiently different positions and distances from the object so as to avoid direct incidence of the light emitted by the light emitting element on the light receiving element.

16. A photoreflective detector according to claim 15, wherein the light emitting section is located at a lower level than the light receiving section, and the second lead frame has a hole for allowing transmission of the light emitted by the light emitting element.

17. A photoreflective detector according to claim 15, further comprising:
   a container for containing the light emitting section and the light receiving section; and
   a light-shielding resin element on at least a part of an outer surface of the container excluding an area used for the optical detection.

18. A photoreflective detector according to claim 17, the light-shielding resin element is provided on the entire outer surface of the container excluding the area used for the optical detection.

19. A photoreflective detector according to claim 15, further having a through-hole extending from a top surface of the light receiving section to a top surface of the light emitting section.

20. A photoreflective detector according to claim 15, further comprising:
   a package formed of a molding resin, the package having the light emitting element and the light receiving element molded therein; and
   a light shielding and absorbing structure for shielding external light and absorbing internal leakage light on at least a part of an outer surface of the package excluding an area used for performing the optical detection.

21. A photoreflective detector according to claim 20, wherein the light shielding and absorbing structure is provided on the entire outer surface excluding the area used for performing the optical detection.

22. A photoreflective detector according to claim 21, wherein the light shielding and absorbing structure is formed as a result of molding one of a thermoplastic resin and a thermosetting resin.

23. A photoreflective detector according to claim 21, wherein the light shielding and absorbing structure is formed as a result of a method selected from the group consisting of coating, printing, plating and vapor deposition.

24. A photoreflective detector according to claim 21, wherein the light shielding and absorbing structure is an irregular structure.

25. A photoreflective detector as recited in claim 1 wherein the light receiving element is a two-dimensional position sensing device.

26. A photoreflective detector as recited in claim 1 including a plurality of light receiving elements and wherein the light emitting element and each of the light receiving elements are located to have sufficiently different positions and distances from the object so as to avoid direct incidence of the light emitted by the light emitting element on any of the light receiving elements.

27. A photoreflective detector for performing optical detection of an object as recited in claim 4 wherein the light receiving element is a two-dimensional position sensing device.

28. A photoreflective detector for performing optical detection of an object as recited in claim 4 including a plurality of light receiving elements and wherein the light emitting element and each of the light receiving elements are located to have sufficiently different positions and distances from the object so as to avoid direct incidence of the light emitted by the light emitting element on any of the light receiving elements.

29. A photoreflective detector for performing optical detection of an object as recited in claim 15 wherein the light receiving section is a two-dimensional position sensing device.

30. A photoreflective detector for performing optical detection of an object as recited in claim 15 wherein the light receiving section is a plurality of light receiving elements, the light emitting element and each of the light receiving elements being located to have sufficiently different positions and distances from the object so as to avoid direct incidence of the light emitted by the light emitting element on any of the light receiving elements.

* * * * *